United States Patent
Usui

(10) Patent No.: US 8,767,025 B2
(45) Date of Patent: Jul. 1, 2014

(54) PRINTER DEVICE, TEMPERATURE ADJUSTMENT METHOD OF PRINTER DEVICE, AND TEMPERATURE ADJUSTMENT SYSTEM OF PRINTER DEVICE

(71) Applicant: Yamaha Hatsudoki Kabushiki Kaisha, Shizuoka-ken (JP)

(72) Inventor: Yusuke Usui, Iwata (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 7 days.

(21) Appl. No.: 13/714,220

(22) Filed: Dec. 13, 2012

(65) Prior Publication Data

US 2013/0188002 A1    Jul. 25, 2013

(30) Foreign Application Priority Data

Jan. 24, 2012    (JP) ................. 2012-011964

(51) Int. Cl.
*B41J 2/465*    (2006.01)
*H05K 3/34*    (2006.01)
*H05K 3/12*    (2006.01)
*B41F 15/26*    (2006.01)

(52) U.S. Cl.
CPC .............. *B41J 2/465* (2013.01); *H05K 3/1216* (2013.01); *H05K 3/34* (2013.01); *B41F 15/26* (2013.01)
USPC .............. 346/78; 346/141; 101/123; 101/129

(58) Field of Classification Search
CPC ................................ H05K 3/34; H05K 3/1216
USPC ....................... 101/114, 123, 129; 346/78, 141
See application file for complete search history.

(56) References Cited

U.S. PATENT DOCUMENTS

| | | | | |
|---|---|---|---|---|
| 6,105,495 | A * | 8/2000 | Takahashi et al. ............ | 101/123 |
| 6,324,973 | B2 * | 12/2001 | Rossmeisl et al. ............ | 101/123 |
| 6,336,402 | B1 * | 1/2002 | Tomomatsu et al. ......... | 101/129 |
| 2005/0077025 | A1 | 4/2005 | Bezama et al. | |
| 2011/0239878 | A1 | 10/2011 | Miyahara et al. | |

FOREIGN PATENT DOCUMENTS

| | | | | | |
|---|---|---|---|---|---|
| EP | 2620283 | | * | 7/2013 | ............ B41F 15/08 |
| JP | 2007-168090 | | * | 7/2007 | ............ H05K 3/34 |
| JP | 2009-241525 | | * | 10/2009 | ............ H05K 3/34 |
| JP | 2010-064425 | A | | 3/2010 | |
| JP | 2010-076285 | | * | 4/2010 | ............ H05K 3/34 |
| JP | 2013-055296 | | * | 3/2013 | ............ H05K 3/34 |

OTHER PUBLICATIONS

The extended European Search Report dated Apr. 12, 2013, which corresponds to EP Application No. 12007740.9 and is related to U.S. Appl. No. 13/714,220.

\* cited by examiner

*Primary Examiner* — Huan Tran
(74) *Attorney, Agent, or Firm* — Studebaker & Brackett PC

(57) ABSTRACT

The inside of a housing of a printer device is cooled by the air from a ventilation port and, consequently, the temperature of solder SP on a mask surface supported by a mask holding frame inside the housing can be kept low. Moreover, provided is a mask cover for blocking the air flow from the ventilation port toward the mask, and the drying of the solder SP caused by the wind from the ventilation port is thereby inhibited as a result of the wind from the ventilation port not coming into contact with the solder SP on the mask surface. In this way, the solder SP is cooled while inhibiting the drying of the solder SP and, consequently, it is possible to appropriately inhibit the change in viscosity of the solder SP, and favorable printing can be realized.

16 Claims, 12 Drawing Sheets

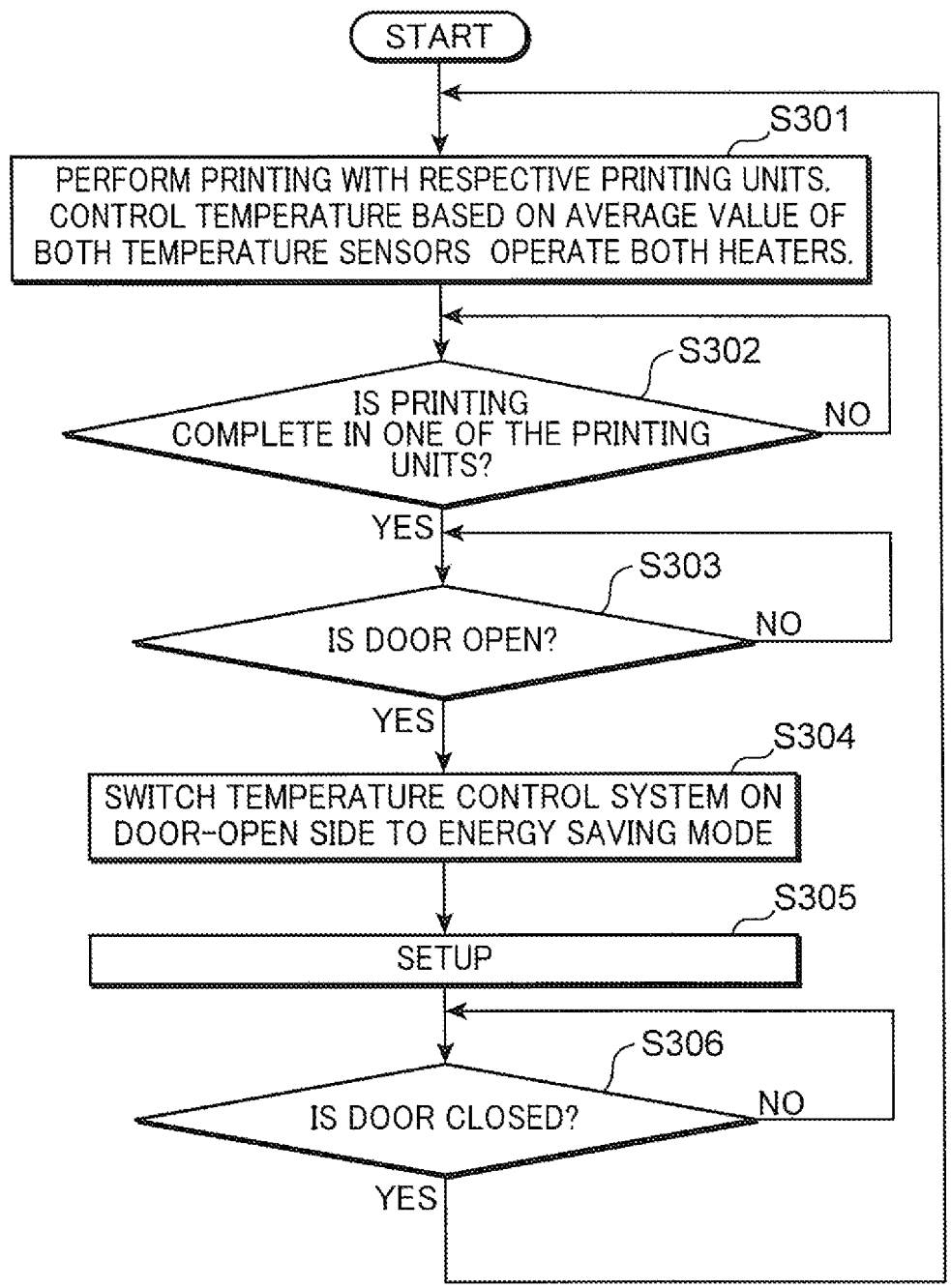

PRINTER DEVICE, TEMPERATURE ADJUSTMENT METHOD OF PRINTER DEVICE, AND TEMPERATURE ADJUSTMENT SYSTEM OF PRINTER DEVICE

BACKGROUND OF THE INVENTION

1. Filed of the Invention

The present invention relates to printing technology of printing a solder on a substrate superimposed on a rear surface of a mask by moving the solder on the surface of the mask, and in particular relates to technology of cooling the solder on the surface of the mask.

2. Description of the Related Art

For example, Japanese Patent Application Publication No. 2010-064425 describes a printer device for printing a solder on a substrate superimposed on a rear surface of a mask plate by moving the solder on the surface of the mask plate. Specifically, with this printer device, when the squeegee which slides on the surface of the mask plate moves while sweeping the solder, the solder possessing viscosity is applied to the substrate via pattern holes on the mask plate. The solder is thereby printed on the substrate.

In order to favorably perform the foregoing solder printing, it is important that the solder on the mask surface possesses appropriate viscosity. Nevertheless, as a result of the temperature of the mask rising due to heat from heat sources inside the device, there was concern that the solder on the mask surface becomes heated and the viscosity thereof changes considerably, and favorable solder printing cannot be performed.

SUMMARY OF THE INVENTION

The present invention was devised in view of the foregoing problems, and an object of this invention is to provide technology capable of realizing favorable printing by inhibiting the change in viscosity of the solder caused by the increase in temperature of the mask.

The printer device according to the present invention is a printer device which prints a solder on a substrate superimposed on a rear surface of a mask via pattern holes of the mask by moving the solder on a surface of the mask supported inside the printer device. In order to achieve the foregoing object, this printer device comprises a ventilation port formed for blowing air into the device from an external air blower, and a mask holding mechanism for holding the mask. Note that the mask holding mechanism includes a support member for supporting the mask, and a blocking member for preventing an air flow introduced from the ventilation port from directly coming into contact with the mask supported by the support member. Moreover, the solder on the surface of the mask is cooled as a result of the inside of the device being cooled by air from the ventilation port.

The temperature regulation method of a printer device according to the present invention is a temperature regulation method of a printer device which prints a solder on a substrate superimposed on a rear surface of a mask via pattern holes of the mask by moving the solder on a surface of the mask supported inside the printer device, and the printer device is provided with a mask holding mechanism including a support member for supporting the mask and a blocking member. Note that the temperature regulation method comprises the steps of cooling the solder on the surface of the mask as a result of cooling an inside of the device by blowing an air flow from a ventilation port to the inside of the device, and blocking the air flow introduced from the ventilation port from directly coming into contact with the mask by means of the blocking member.

The temperature regulation system of a printer device according to the present invention is a temperature regulation system of a printer device comprising a printer device which prints a solder on a substrate superimposed on a rear surface of a mask via pattern holes of the mask by moving the solder on a surface of the mask, and an air blower for blasting air into the printer device from a ventilation port provided to the printer device. Note that the printer device includes a ventilation port formed for blowing air into the device from an external air blower, and a mask holding mechanism for holding the mask. The mask holding mechanism includes a support member for supporting the mask, and a blocking member for preventing an air flow introduced from the ventilation port from directly coming into contact with the mask supported by the support member. The solder on the surface of the mask is cooled as a result of the inside of the device being cooled by air from the ventilation port.

With the invention (printer device, temperature regulation method of a printer device, and temperature regulation system of a printer device), since the inside of the device is cooled by the air from a ventilation port, consequently, the temperature of the solder on the mask surface supported by a support member inside the printer device can be kept low. However, upon adopting this kind of blast cooling, a separate problem arises in that the wind from the ventilation port comes into contact with the solder and dries the solder. Meanwhile, with the present invention, provided is a blocking member for blocking the air flow from the ventilation port toward the mask, and the drying of the solder caused by the wind from the ventilation port is inhibited by preventing the wind from the ventilation port from coming into contact with the solder on the mask surface. Accordingly, the present invention cools the solder while inhibiting the drying of the solder and, consequently, it is possible to realize favorable printing while appropriately inhibiting the change in viscosity of the solder.

These and other objects, features and advantages of the present invention will become apparent upon reading of the following detailed description along with the accompanied drawings.

BRIEF DESCRIPTION OF DRAWINGS

FIG. 12 is a flowchart showing the temperature regulation operation in the housing that is executed in the fifth embodiment.

DETAILED DESCRIPTION OF INVENTION

First Embodiment

Figure 1:
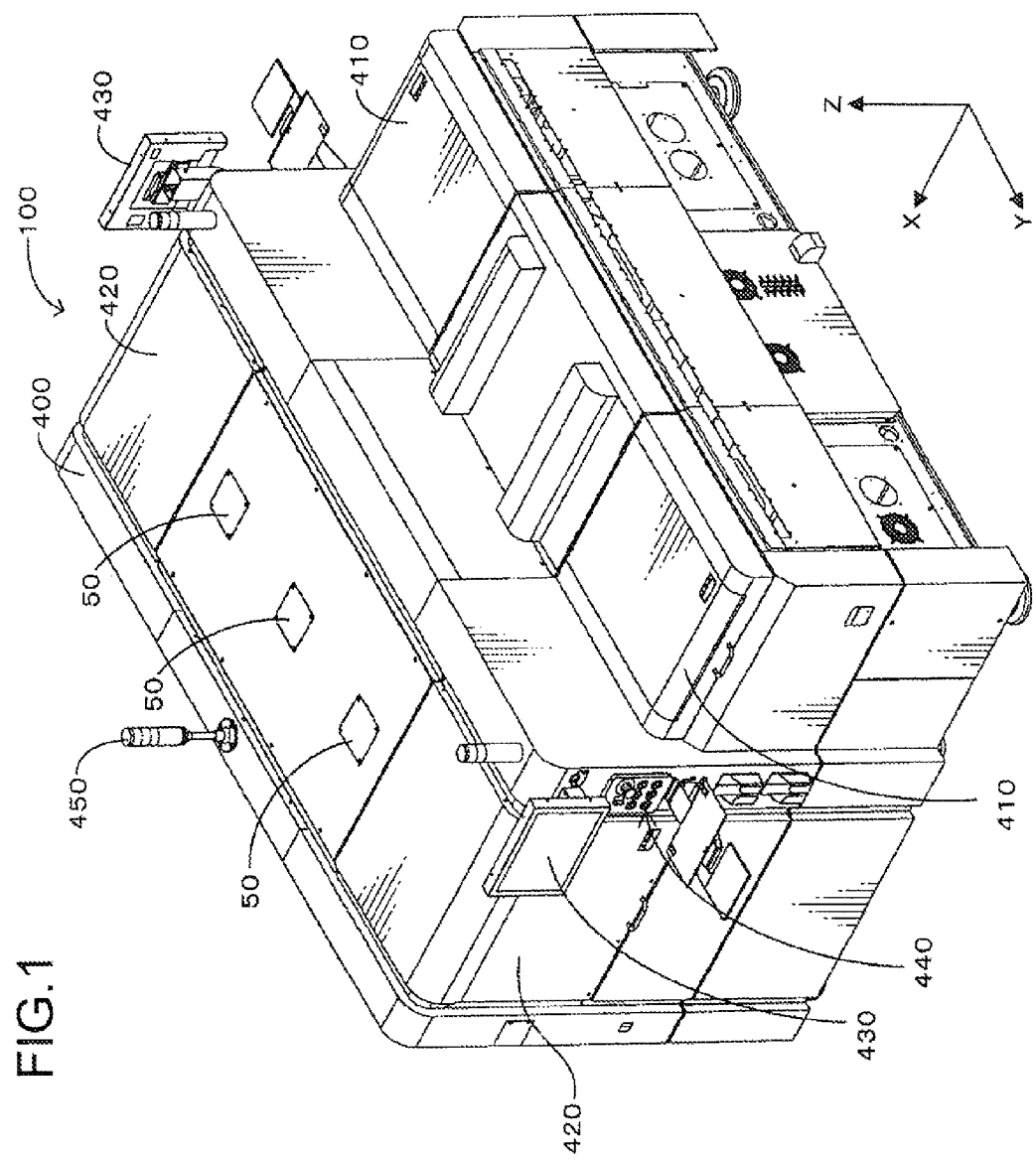
FIG. 1 is a perspective view showing the outline of the overall printer device to which the present invention can be applied.
Figure 2:
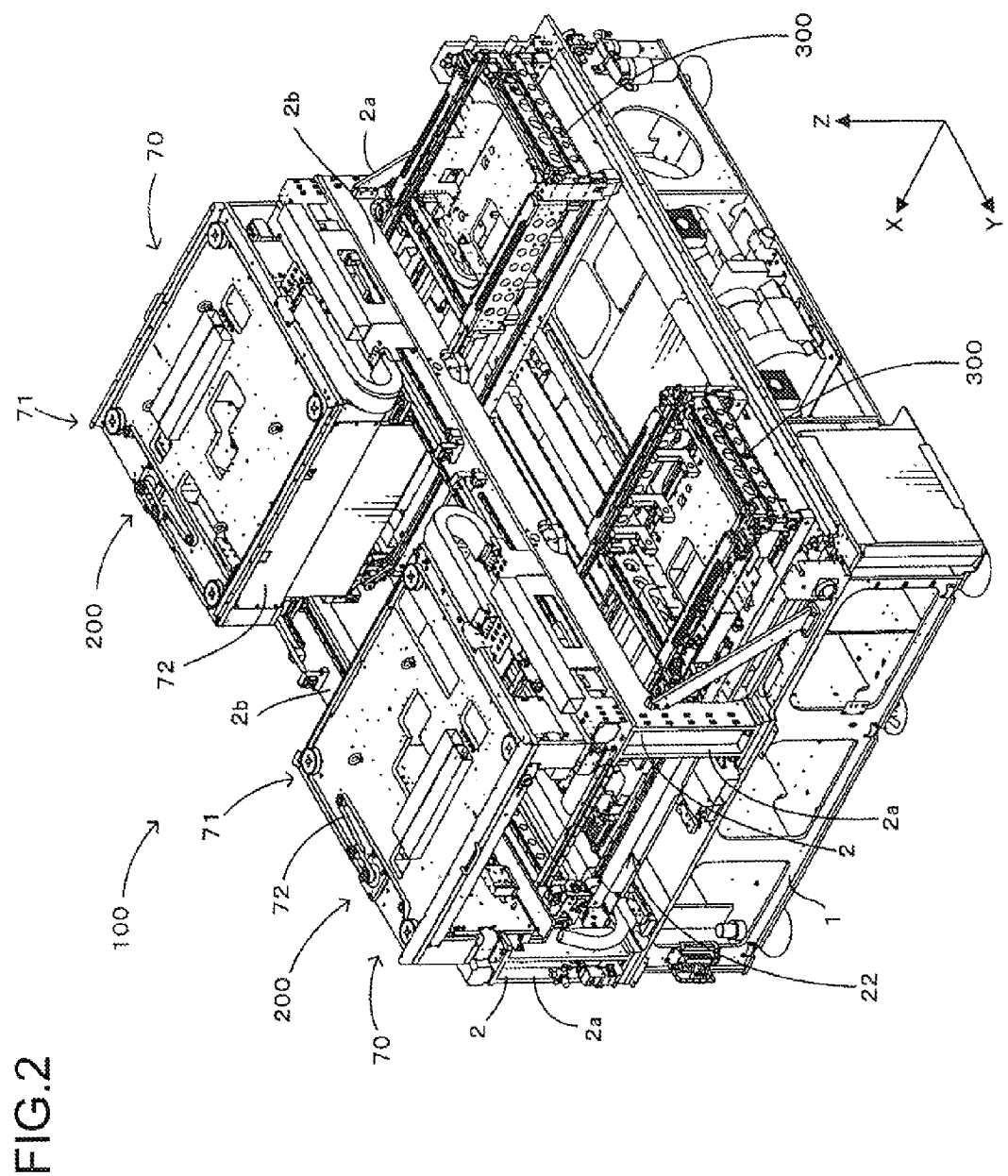
FIG. 2 is a perspective view showing the configuration inside the printer device illustrated in FIG. 1.
Figure 3:
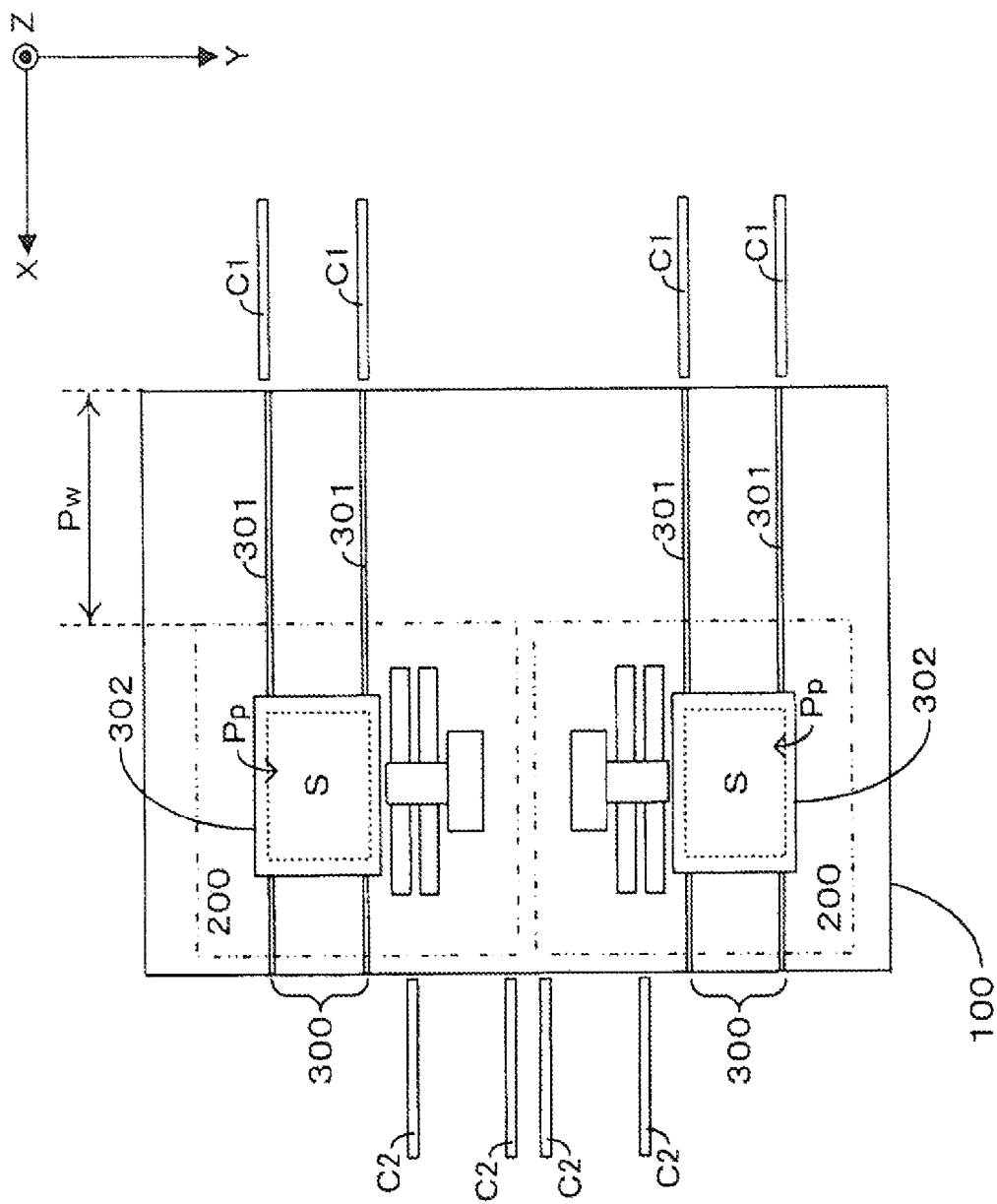
FIG. 3 is a plan view schematically showing the partial configuration inside the printer device illustrated in FIG. 1.

FIG. 1 is a perspective view showing the outline of the overall printer device to which the present invention can be applied. FIG. 2 is a perspective view showing the configuration inside the printer device illustrated in FIG. 1, and shows a state where the housing is removed from FIG. 1. FIG. 3 is a plan view schematically showing the partial configuration inside the printer device illustrated in FIG. 1. These diagrams and the following diagrams show, as needed, the XYZ orthogonal coordinate axes for showing the positional relationship of the respective parts of the device. Moreover, as needed, the arrow direction of the respective coordinate axes are treated as the positive side, and the reverse direction of the arrow of the respective coordinate axes are treated as the negative side.

The printer device 100 comprise a schematic configuration of housing, in a housing 400, two printing units 200 aligned in the Y axis direction, and two substrate carrying units 300 aligned in the Y axis direction and provided in correspondence with the printing units 200 one-on-one. In addition, the printing units 200 respectively perform printing on a substrate S which was carried by the corresponding substrate carrying units 300.

The printer device 100 comprises a support mechanism configured from a substantially rectangular base 1 and two support frames 2 mounted on the upper face of the base 1 for supporting the printing units 200 and the substrate carrying units 300 (FIG. 2). Each of these support frames 2 is a gate-type frame configured by bridging a beam member 2b extending in the Y axis direction over pillar members 2a provided to either end of the base 1 in the Y axis direction. As shown in FIG. 2, of the two support frames 2, one support frame 2 is disposed at the center of the base 1 in the X axis direction, and the other support frame 2 is disposed at the end of the base 1 in the X axis normal direction. In addition, the printing units 200 are supported by the upper face of the base 1 between the two support frames 2 aligned in the Y axis direction. Meanwhile, the substrate carrying units 300 are supported by the upper face of the base 1 by extending in the X axis direction so as to pass through the gate-type support frames 2.

As shown in FIG. 3, a carry-in conveyor pair C1 and a carry-out conveyor pair C2 are provided to both outer sides of the printer device 100 in the X axis direction. The carry-in conveyor pair C1 and the carry-out conveyor pair C2 are provided in two pairs each in the form of corresponding one-on-one to the two substrate carrying units 300 of the printer device 100. In addition, the carry-in conveyor pair C1 is disposed on the X axis negative side of the printer device 100, and carries the substrate S toward the corresponding substrate carrying unit 300. Meanwhile, the carry-out conveyor pair C2 is disposed on the X axis positive side of the printer device 100, and receives the substrate S that was carried out from the corresponding substrate carrying unit 300. Note that both the carry-in conveyor pair C1 and the carry-out conveyor pair C2 are configured to move freely in the Y axis direction, and, upon the transfer of the substrate S to and from the substrate carrying unit 300 and the printing unit 200, move to a position that is linearly aligned in the X axis direction of the foregoing substrate carrying unit 300 and the printing unit 200.

Each of the substrate carrying units 300 can carry the substrate S, which was carried in from the corresponding carry-in conveyor pair C1, to the corresponding carry-out conveyor pair C2, and stop the substrate S at the midway standby position Pw or printing position Pp as needed. Specifically, the substrate carrying unit 300 comprises a configuration which support a substrate table 302 at the upper part of two slide mechanisms 301 extending in the X axis direction. In addition, as a result of the substrate table 302 moving in the X axis direction in the state of retaining the substrate S at the upper face thereof, the substrate carrying unit 300 causes the substrate S received from the carry-in conveyor pair C1 to stand by at the standby position Pw in front of the printing unit 200, carries the substrate S to the printing position Pp in the printing unit 200, and carries the substrate S, to which printing was performed at the printing position Pp, to the carry-out conveyor pair C2.

Meanwhile, each of the printing units 200 perform printing to the substrate S that was carried by the corresponding substrate carrying units 300. The detailed configuration for executing this printing operation is now explained with reference to FIG. 1 to FIG. 3 and FIG. 4. Note that, with the printer device 100, a pair configured from the printing unit 200 and the substrate carrying unit 300 is provided in two pairs, but since the configuration of these pairs is the same, only the explanation of one pair is provided below.

Figure 4:
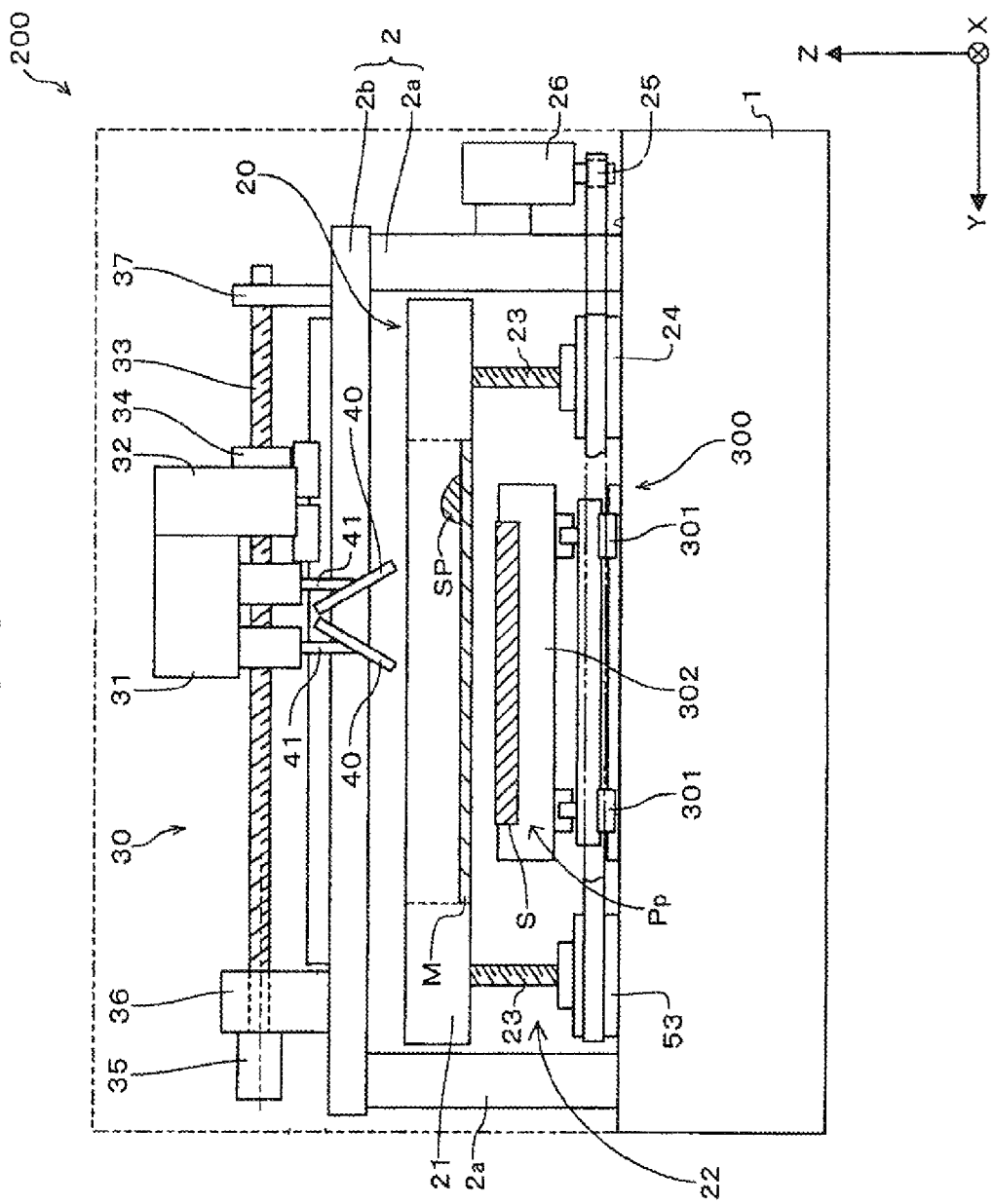
FIG. 4 is a side view showing the configuration inside the printer device illustrated in FIG. 1.

FIG. 4 is a side view showing the internal configuration of the printer device illustrated in FIG. 1. As described above, the printer device 100 comprises the substrate carrying unit 300 provided to the upper face of the base 1. The substrate carrying unit 300 includes two slide mechanisms 301 disposed in the Y axis direction at predetermined intervals, and a substrate table 302 which is supported in a freely movable manner in the X axis direction relative to the slide mechanisms 301. Moreover, the slide mechanisms 301 can move in the X axis direction by a drive mechanism not shown. Thus, the substrate table 302 can move in the Y axis direction in addition to the X axis direction. A plurality of pins (not shown) extending upward are mounted on the substrate table 302, and the substrate S is mounted on these plurality of pins. In addition, the substrate table 302 can move, as needed, while supporting the substrate S mounted on the pins.

Moreover, the printer device 100 comprises a mask raising/lowering mechanism 20 for raising and lowering the mask M above the substrate carrying unit 300. The mask raising/lowering mechanism 20 is disposed between the foregoing support frames 2 aligned in the Y axis direction at the upper face of the base 1, and comprises a schematic configuration of raising and lowering the mask M by causing the frame drive unit 22 to raise and lower the mask holding frame 21 holding the mask M. The frame drive unit 22 raises and lowers the mask holding frame 21 by causing a servo motor 26 to rotate, via a belt 25, a pulley 24 which is threadably mounted on each of the four ball screw shafts 23 extending downward (Z axis negative direction) from the mask holding frame 21.

In addition, upon printing on the substrate S, the mask raising/lowering mechanism 20 lowers the mask M. Consequently, the lower face of the mask M is superimposed on the upper face of the substrate S that was carried/fixed to the printing position Ps below the mask M retained by the mask holding frame 21. Meanwhile, after printing on the substrate S, the mask raising/lowering mechanism 20 raises the mask M so as to separate the rear surface of the mask M from the upper face of the substrate S (state of FIG. 4).

In addition, the printer device 100 comprises, above the mask raising/lowering mechanism 20, a printing mechanism 30 which is supported by beam members 2b of the support frames 2. The printing mechanism 30 prints a solder on the substrate S via pattern holes formed on the mask M by sliding a squeegee 40 in the Y axis direction on the upper face of the mask M, to which the solder was supplied, in a state where the mask M is superimposed on the substrate S.

As shown in FIG. 4, the printing mechanism 30 includes a squeegee 40 (squeegee on the left side of FIG. 4) for sliding the mask M in the Y axis normal direction, and a squeegee 40 (squeegee on the right side of FIG. 4) for sliding the mask M in the Y axis negative direction. In addition, the printing mechanism 30 includes a printing pressure application unit 31 for retaining the respective squeegees 40 via a rod 41 which is extendable/contractible in the vertical direction. The printing pressure application unit 31 lowers the squeegee 40 of the two squeegees 40 according to the sliding direction upon printing, and applies a predetermined printing pressure on the upper face of the mask M.

Moreover, with the printing mechanism 30, a solder supply unit 32 for supplying a solder to the upper face of the mask M is mounted on the printing pressure application unit 31, and the printing pressure application unit 31 and the solder supply unit 32 can integrally move in the Y axis direction via the ball screw mechanism. Specifically, a nut member 34 which is threadably mounted on the ball screw shaft 33 extending in the Y axis direction is mounted on the solder supply unit 32, and, when the ball screw shaft 33 is rotated by the servo motor 35, the printing pressure application unit 31 and the solder supply unit 32 move in the Y axis direction. Accordingly, by pressing the squeegee 40 on the upper face of the mask M and operating the servo motor 35 and sliding the squeegee 40 in the Y axis direction on the upper face of the mask M, which was supplied with a paste-like solder SP (cream solder), the solder can be printed on the substrate S.

Note that either end of the ball screw shaft 33 in the axial direction is rotatably supported by the fixing member 36, 37 mounted on either end on the upper face of the beam member 2b in the Y axis direction, and the servo motor 35 is fixed to the fixing member 36.

Meanwhile, as shown in FIG. 1, the internal configuration of the foregoing printer device 100 is housed inside the housing 400. The housing 400 is provided with a door 410 which opens/closes the portion corresponding to the standby position Pw, and a door 420 which opens/closes the portion corresponding to the printing position Pp. Accordingly, the operator can open the respective doors 410, 420 and perform predetermined setup procedures at the standby position Pw or the printing position Pp.

Moreover, the housing 400 is provided with various interfaces with the operator. Specifically, a display panel 430 and an operation panel 440 are provided in a manner of being aligned vertically on the side of the door 420 for the printing position Pp. The display panel 430 fulfills the function of displaying the printing status to the substrate S by the printing unit 200, and the carrying status of the substrate S by the substrate carrying unit 300. Meanwhile, the operation panel 440 is provided with a door open/close switch 440a for opening and closing the doors 410, 420. Accordingly, when the operator confirms, via the display panel 430, that the printing unit 200 has completed the printing to predetermined number of substrates S, the operator can open the doors 410, 420 with the door open/close switch 440a and perform predetermined setups, and, after completing such setups, and close the doors 410, 420 with the door open/close switch 440a to prepare for the subsequent printing operation. Note that the door open/close switch 440a is provided to each of the doors 410, 420, and one of the doors 410, 420 can be selectively opened or closed by operating the corresponding door open/close switch 440a.

Moreover, the operation panel 440 is also provided with an emergency stop button 440b for urgently stopping the operation of the printing unit 200 or the substrate carrying unit 300. Accordingly, when the operator confirms some kind of abnormality with the display panel 430, the operator can stop the printing unit 200 and the substrate carrying unit 300 with the emergency stop button 440b, and open the doors 410, 420 with the door open/close switch 440a to perform predetermined repair work. Note that the doors 410, 420, the display panel 430, and the operation panel 440 are provided to each pair configured from the printing unit 200 and the substrate carrying unit 300. In addition, the housing 400 is also provided with an indicator light 450 for notifying an abnormality of the printer device 100 to the operator who is positioned away from the printer device 100.

In addition, three ventilation ports 50 are formed, by being aligned in the Y axis direction, in a manner of penetrating the upper face of the housing 400 as shown in FIG. 1. These ventilation ports 50 are positioned above the Z axis direction (vertical direction) of the two printing units 200 aligned in the Y axis direction inside the housing 400, and are used for sending the air flow from the air conditioner into the housing 400 as described later. Note that, in an unused state, the ventilation ports 50 are closed by a ventilation port cover, and FIG. 1 shows a state where all three ventilation ports 50 are closed by the ventilation port cover.

Figure 5:
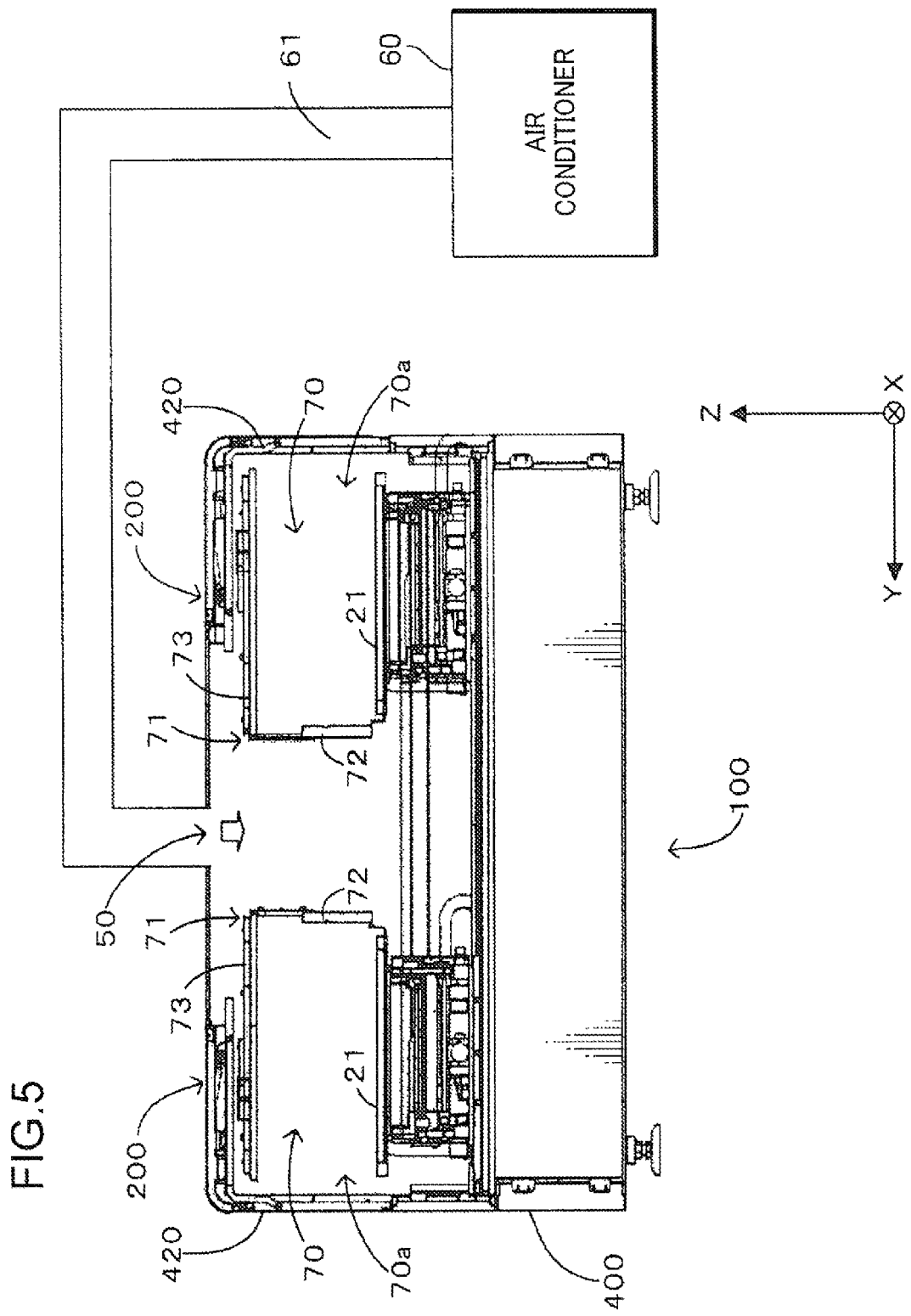
FIG. 5 is an explanatory diagram explaining the structure which cools the inside of the housing of the printer device.

In addition, the printer device 100 of the first embodiment comprises a structure where the inside of the housing 400 can be cooled with the air that is blasted from the ventilation ports 50. This is now explained in further detail with reference to FIG. 2 and FIG. 5. Here, FIG. 5 is an explanatory diagram explaining the structure of cooling the inside of the housing of the printer device, and shows the state where an air conditioner is connected to the printer device 100 when viewed from the X axis direction. Note that, in these diagrams, the illustration of certain members such as the printing mechanism 20 is omitted.

In the example shown in FIG. 5, among the three ventilation ports 50, a duct extending from the air conditioner is mounted on the center ventilation port 50, and the ventilation ports 50 on either end are closed with a ventilation port cover. In addition, the air that is blown out from the air conditioner 60 passes through the duct 61 and thereafter enters the housing 400 via the ventilation port 50. Consequently, a downward air flow heading vertically downward from the ventilation port 50 as shown with the arrow in FIG. 5 is generated inside the housing 400, and the entire inside of the housing 400 is thereby cooled.

Note that, if the air from the ventilation port 50 directly comes into contact with the solder on the upper face of the mask M, the volatile substance contained in the flux of the solder will evaporate, and cause the solder to become dried. Thus, in the first embodiment, a mask cover 71 for blocking the wind heading from the ventilation port 50 toward the (mask M of the) mask holding frame 21 is provided to each of the two printing units 200. The mask cover 71 is configured from a wall panel 72 extending upward in the vertical direction (Z axis direction) from an end of the mask holding frame 21 in the Y axis direction, and a top panel 73 which covers the mask holding frame 21 from above by extending in the Y axis direction from the upper end of the wall panel 72. In addition, the mask covers 71 of the two printing units 200 are disposed so that each of the wall panels 72 faces each other by facing the inner side of the housing 400. Accordingly, the air from the ventilation port 50 provided so as to face the space between the wall panels 72 vertically from above is blocked by the mask covers 71 (wall panels 72 of the mask cover 71) provided between the ventilation port 50 and the mask holding frame 21, and will not directly come into contact with the solder on the upper face of the mask M retained by the mask holding frame 21. Meanwhile, so that the operability by the operator is not hindered as a result of providing the mask covers 71, the mask covers 71 provided to the two printing units 200 are opened toward the outside of the housing 400.

To put it differently, the mask holding mechanism 70 is configured from the mask holding frame 21 and the mask cover 71. In addition, the mask holding mechanism 70 blocks the portion facing the inner side of the housing 400 with the wall panel 72 to block the wind from the ventilation port 50 on the one hand, and opens the portion facing the outside of the housing 400 (opening 70a). Accordingly, with the printing units 200, the respective openings 70a, can be opened and closed by opening and closing the correspondingly provided doors 420. From the perspective of the operator, the operator can open the door 420 to access the mask holding frame 21 from the opening 70a, and execute setups such as the replacement of the mask M.

Moreover, the mask holding mechanism 70 configured as described above also has the function of efficiently cooling the solder on the upper face of the mask M supported by the mask holding frame 21. In other words, since the wall panel 72 of the mask holding mechanism 70 is facing the flow path of the air from the ventilation port 50, it is cooled by the wind from the ventilation port 50. Meanwhile, the mask holding frame 21 and the wall panel 72 and the top panel 73 of the mask cover 71 configuring the mask holding mechanism 70 are mutually connected to mutually possess thermal conductivity. Accordingly, when the wall panel 72 is cooled by the wind from the ventilation port 50, the top panel 73 and the mask holding frame 21 having the foregoing thermal conductivity are also cooled, and the solder on the upper face of the mask M of the mask holding frame 21 is also cooled. Here, if the mask holding frame 21, the wall panel 72 and the top panel 73 are configured from metal possessing high thermal conductivity, the cooling efficiency of the solder on the upper face of the mask M can be further improved.

As explained above, with this embodiment, the inside of the housing 400 of the printer 100 is cooled by the wind from the ventilation port 50 and, consequently, the temperature of the solder SP on the mask M surface supported by the mask holding frame 21 inside the housing 400 can be kept low. However, upon adopting this kind of blast cooling, a separate problem arises in that the wind from the ventilation port 50 comes into contact with the solder SP and dries the solder SP. Meanwhile, with this embodiment, provided is a mask cover 71 for blocking the air flow from the ventilation port 50 toward the mask M, and the drying of the solder SP caused by the wind from the ventilation port 50 is inhibited by preventing the wind from the ventilation port from coming into contact with the solder SP on the mask M surface. Accordingly, the present invention cools the solder SP while inhibiting the drying of the solder SP and, consequently, it is possible to realize favorable printing while appropriately inhibiting the change in viscosity of the solder SP.

In addition, with this embodiment, the mask cover 71 has thermal conductivity with the mask holding frame 21, and is configured such that, by the mask cover 71 being cooled by the wind from the ventilation port 50, the surface of the mask M supported by the mask holding frame 21, which has thermal conductivity with the mask cover 71, is cooled. With the foregoing configuration where the mask cover 71 which blocks the wind from the ventilation port 50 is given thermal conductivity relative to the mask holding frame 21, when the mask cover 71 is cooled by the wind from the ventilation port 50, the surface of the mask M supported by the mask holding frame 21 is also cooled, and, consequently, the solder SP on the mask M surface can be efficiently cooled. Accordingly, it is possible to reliably cool the solder SP while inhibiting the solder SP from becoming dry by preventing the wind from the ventilation port 50 from coming into contact with the solder SP, and more effectively yield the effect of realizing favorable printing while appropriately inhibiting the change in viscosity of the solder SP.

In particular, with the foregoing printer device 100, the servo motors 26, 35 and the like provided inside the housing 400 become heat sources, and the solder SP on the upper face of the mask M is heated and the viscosity thereof tends to change. Meanwhile, in this embodiment, since the solder SP is cooled while inhibiting the drying of the solder SP, regardless of the existence of a heat source, it is possible to appropriately inhibit the change in viscosity of the solder SP and realize favorable printing.

Moreover, in this embodiment, two mask holding mechanisms 70 are aligned and disposed, and the wall panel 72 of each of the two mask holding mechanisms 70 can be cooled by the wind from one air conditioner 60. With the printer device 100 which enables the cooling of the mask cover 71 of each of the two mask holding mechanisms 70 by the wind from one air conditioner 60 as described above, the number of air conditioners 60 can be reduced in comparison to the case of providing, for each of the two mask holding mechanisms 70, the air conditioner 60 for regulating the temperature of the mask cover 71. Thus, this is advantageous in reducing the installation area and cost of the air conditioner 60.

Moreover, in this embodiment, each of the two mask holding mechanisms 70 is formed with an opening 70a which opens toward an opposite side of other mask holding mechanism 70, and a door 420 which allows access to the opening 70a from the outside of the device is provided respectively to the two mask holding mechanisms 70. With this kind of configuration, upon performing a setup operation such as replacing the mask M of the mask holding mechanism 70, the operator can access the mask holding mechanism 70 via the opening 70a by opening the door 420, and thereby perform the setup operation. Meanwhile, upon performing solder printing on the substrate S, the temperature inside the housing 400 can be stabilized without depending on the outside temperature by closing the door 420, and, therefore, it is possible to effectively realize favorable printing using a solder SP having appropriate viscosity.

Moreover, in this embodiment, each of the two mask holding mechanisms 70 is blocked on the side of the other mask holding mechanism 70. As a result of adopting the foregoing configuration, the atmosphere can be separated between the two mask holding mechanisms 70, and it is possible to inhibit the atmosphere temperature of one mask holding mechanism 70 from affecting the atmosphere temperature of the other mask holding mechanism 70. Accordingly, while performing the setup operation to one mask holding mechanism 70, it is possible to perform solder printing using the other mask holding mechanism 70 under stable atmosphere temperature. Thus, there is no need to stop the printing using the other mask holding mechanism 70 in order to perform the setup operation to the one mask holding mechanism 70, and solder printing can be efficiently performed on the substrate S.

Second Embodiment

The printer device 100 of the second embodiment regulates the temperature of the mask M surface by controlling the air conditioner 60 based on the detection result of the temperature sensors SC (FIG. 6) in which one is provided to each of the two mask holding mechanisms 70. Note that the remaining configuration of the second embodiment is common with the foregoing embodiment and, therefore, the differences with the foregoing embodiment are mainly explained below. By way of reference, in the second embodiment also, it goes without saying that the same effect can be yielded by comprising the common configuration as the foregoing embodiment.

Figure 6:
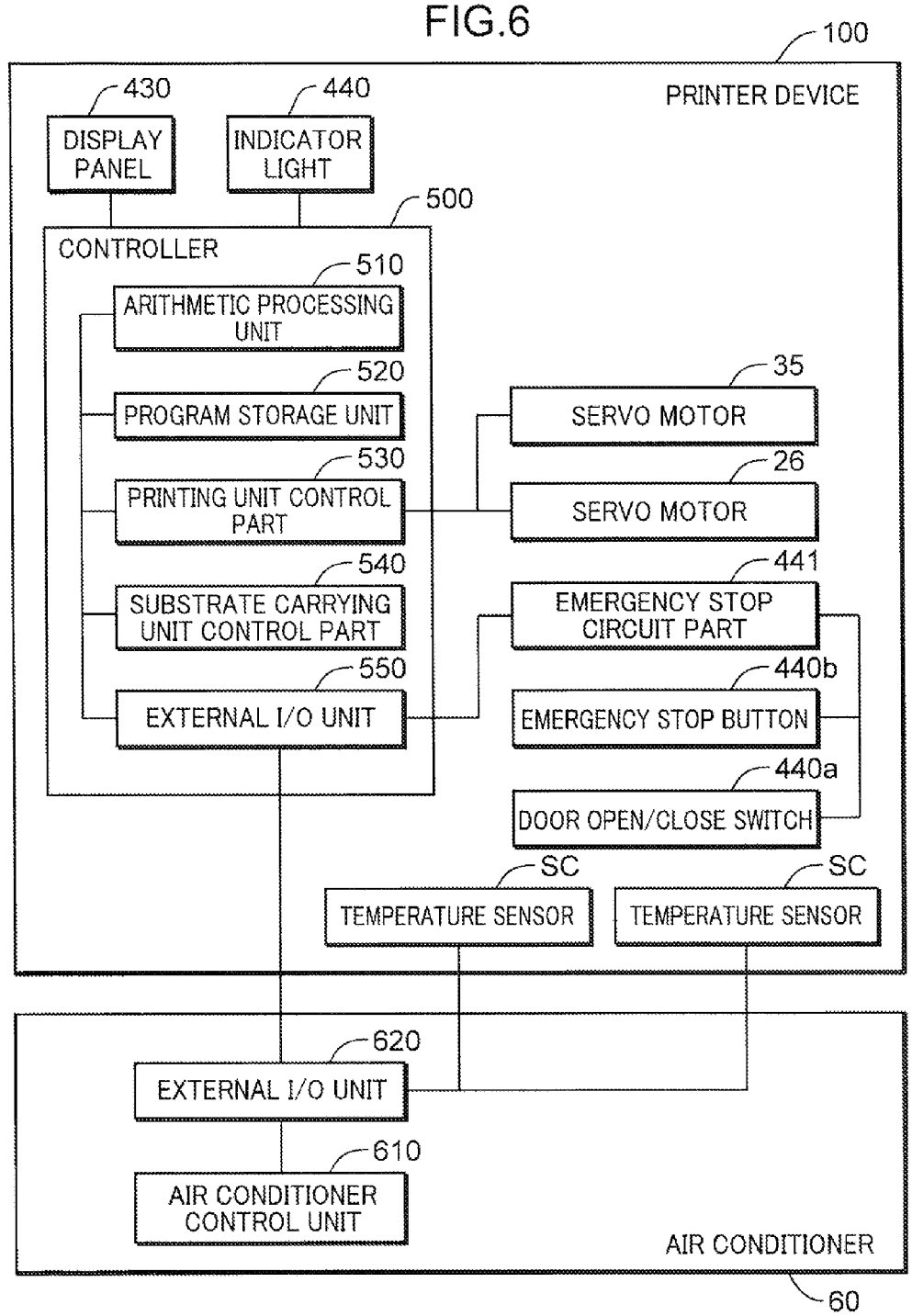
FIG. 6 is a block diagram showing the electrical configuration that can be applied to the printer device of FIG. 1.

FIG. 6 is a block diagram showing the electrical configuration of the temperature regulation system of a printer device which is configured from the printer device illustrated in FIG. 1 and an air conditioner for regulating the temperature of the device, and the control operation of the second embodiment is executed by the electrical configuration of FIG. 6. As shown in FIG. 6, the printer device 100 is provided with a controller 500. The controller 500 is provided with an arithmetic processing unit 510 configured from a central processing unit (CPU) and which governs the operational control of the respective parts of the printer device 100, and a program storage unit 520 for storing printing programs used for the printing operation. In addition, the arithmetic processing unit 510 executes the solder printing on the substrate S by controlling the printing unit control part 530 and the substrate carrying unit control part 540 based on the printing programs stored in the program storage unit 520.

The printing unit control part 530 governs the control of the foregoing printing unit 200, and specifically executing printing by controlling the raising/lowering operation of the mask M and the sliding operation of the squeegee 40 by issuing commands to the servo motors 26, 35 as needed. Meanwhile, the substrate carrying unit control part 540 governs the function of controlling the carrying of the substrate by the foregoing substrate carrying unit 300. Moreover, the external I/O unit 550 functions as an interface of the controller 500 and the outside.

In addition, when the foregoing door open/close switch 440a and the emergency stop button 440b are turned ON, the emergency stop circuit part 441 provided to the printer device 100 is configured to output a print stop signal to the arithmetic processing unit 510 of the controller 500 via the external I/O unit 550. Accordingly, when the arithmetic processing unit 510 receives the foregoing print stop signal, the arithmetic processing unit 510 controls the substrate carrying unit control part 540 and the printing unit control part 530 and stops the printing in progress.

Meanwhile, the air conditioner 60 is internally provided with an air conditioner control part 610 for governing the operational control of the respective parts of the air conditioner 60, and an external I/O unit 620 which functions as an interface of the air conditioner control part 610 and the outside of the air conditioner 60. Specifically, the external I/O unit 620 of the air conditioner 60 is connected to the external I/O unit 550 of the printer device 100, and information is exchanged between the air conditioner 60 and the printer device 100 via the external I/O units 620, 550. To illustrate an example, the printer device 100 sends, to the air conditioner 60, information showing the execution status of the printing operation inside the device and the open/close status of the door 420. Meanwhile, the air conditioner 60 sends, to the printer device 100, information showing the execution status of temperature regulation and the generation of errors in the temperature regulation. In addition, the external I/O unit 620 of the air conditioner 60 is connected to the temperature sensors SC provided respectively to the two mask holding mechanisms 70 in the printer device 100. Each of the temperature sensors SC outputs, to the air conditioner control part 610 via the external I/O unit 620, the results upon detecting the surface temperature of the mask M supported by the corresponding mask holding mechanism 70. In addition, the air conditioner control part 610 controls the operation of the air conditioner 60 based on the detection result that was input from the temperature sensors SC, and regulates the temperature in the housing 400.

Figure 7:
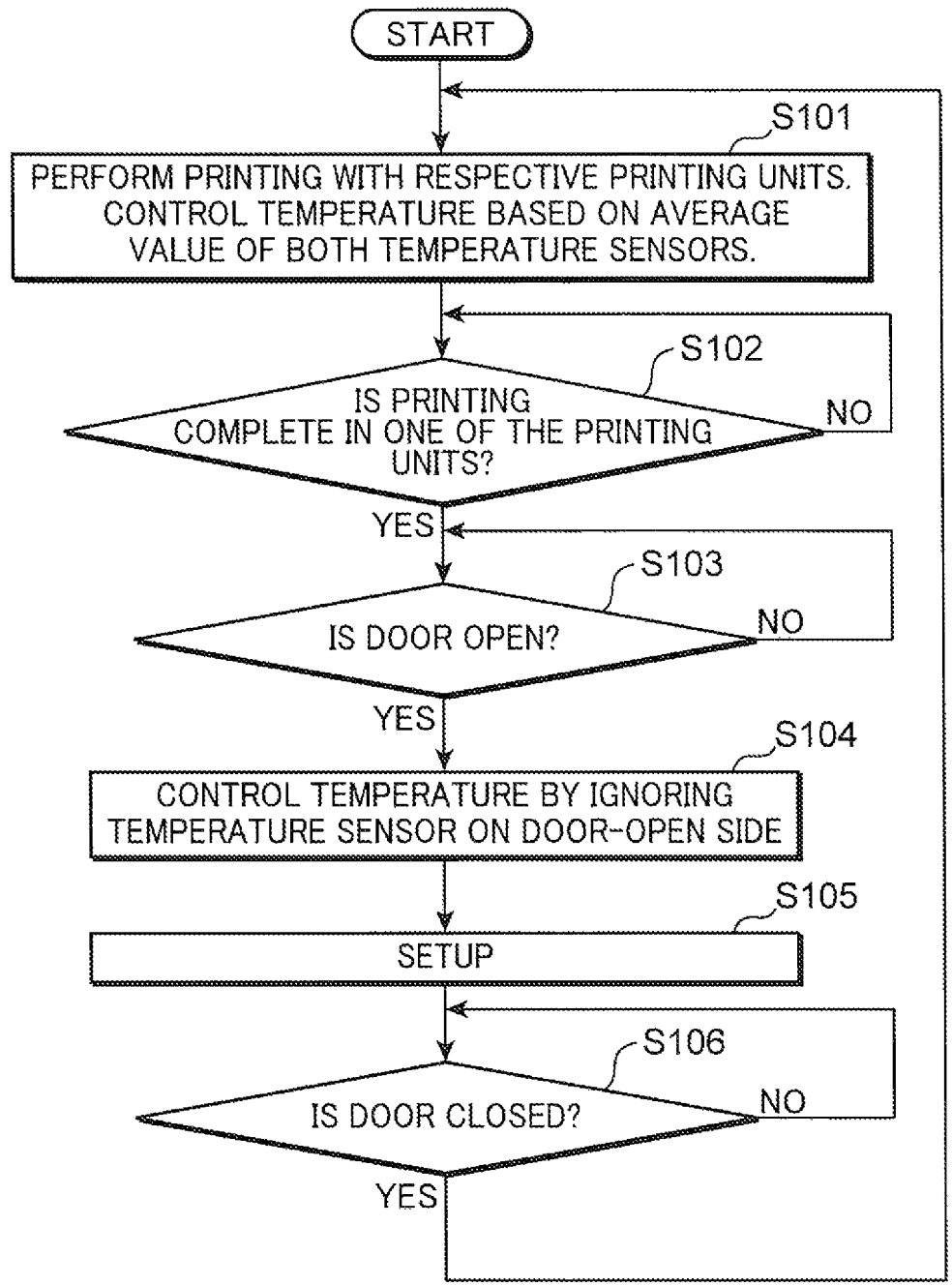
FIG. 7 is a flowchart showing the temperature regulation operation in the housing that is executed in the second embodiment.

FIG. 7 is a flowchart showing the temperature regulation operation in the housing that is executed in the second embodiment. While the solder printing to the substrate S is being performed by both of the two printing units 200, the air conditioner control part 610 controls the operation of the air conditioner 60 based on the average value of the detection results of the two temperature sensors SC (step S101). Consequently, it is possible to cool the solder SP on the upper face of the mask M in the mask holding mechanisms 70 of each of the two printing units 200, and favorable printing based on a solder SP having appropriate viscosity can be executed.

Meanwhile, of the two printing units 200, when one printing unit 200 completes its printing (step S102), and the operator opens the door 420 of the printing unit 200 for the setup operation after the printing is complete (step S103), step S104 is executed. In step S104, the air conditioner control part 610 ignores the detection result of the temperature sensor SC provided to the mask holding mechanism 70 of the printing unit 200 of the open door 420 side, and controls the operation of the air conditioner 60 only based on the detection result of the temperature sensor SC provided to the mask holding mechanism 70 of the printing unit 200 on the closed door 420 side.

In other words, the atmosphere temperature of the mask holding mechanism 70 on the open door 420 side may change considerably due to the inflow of air from the outside of the printer device 100. In the foregoing case, if the detection result of the temperature sensor SC of the mask holding mechanism 70, in which the atmosphere temperature had changed to the outside air, is reflected in the operation of the air conditioner 60, the atmosphere temperature of the mask holding mechanism 70 that is performed the printing operation inside the closed door 420 will become unstable. In order to avoid this, here, temperature regulation is performed by ignoring the detection result of the temperature sensor SC provided to the mask holding mechanism 70 of the printing unit 200 on the open door 420 side. Consequently, the solder SP on the upper face of the mask M can be cooled in the mask holding mechanisms 70 of the printing unit 200 on the closed door 420 side, and favorable printing using a solder SP having appropriate viscosity can be performed. In addition, when the operator completes the setup operation (step S105) and closes the door 420 that was open (step S106), the routine returns to the temperature regulation operation in step S101.

As explained above, in this embodiment, provided is an air conditioner control part 610 for controlling the blast from the air conditioner 60 and regulating the temperature of the mask M surface. As a result of comprising the air conditioner control part 610 for controlling the blast from the air conditioner 60, it is possible to stabilize the temperature of the upper face of the mask M and consequently the temperature of the solder SP on the upper face of the mask. Thus, it is possible to effectively realize favorable printing using a solder SP having appropriate viscosity.

Moreover, in this embodiment, the temperature sensors SC are provided to each of the two mask holding mechanisms 70, and the blast from the air conditioner 60 is controlled based on the detection results of these temperature sensors SC. As a result of controlling the blast from the air conditioner 60 based on the detection results of the temperature sensors SC as described above, it is possible to surely stabilize the temperature of the solder SP on the upper face of the mask M, and effectively realize favorable printing using a solder SP having appropriate viscosity.

Moreover, in this embodiment, the detection result of the temperature sensor SC provided to the mask holding mechanism 70 facing the opened door 420 is ignored, and the blast from the air conditioner 60 is controlled based on the detection result of the temperature sensor SC provided to the mask holding mechanism 70 facing the closed door 420. With the foregoing configuration, it is possible to eliminate the influence of the atmosphere temperature of the mask holding mechanism 70 that is not used in printing since the door 420 is open, and regulate the atmosphere temperature of the mask holding mechanism 70 that can be used in printing since the door 420 is closed. Accordingly, even if the atmosphere temperature of the mask holding mechanism 70 changes considerably due to the outside air since the door 420 is open, the mask holding mechanism 70 in which the door 420 is closed can be used to perform printing with a stable temperature regardless of the foregoing temperature change. Consequently, it is possible to stabilize the temperature of the solder SP on the upper face of the mask M, and effectively realize favorable printing using a solder SP having appropriate viscosity.

Third Embodiment

In the foregoing embodiment, the duct from the air conditioner 60 was connected to the center ventilation port 50 among the three ventilation ports 50 provided to the housing 400. Meanwhile, in the third embodiment, the duct from the air conditioner 60 is connected to the respective ventilation ports 50 on either side among the three ventilation ports 50. Note that the remaining configuration of the third embodiment is common with the foregoing embodiments and, therefore, the differences with the foregoing embodiments are mainly explained below. By way of reference, in the third embodiment also, it goes without saying that the same effect can be yielded by comprising the common configuration as the foregoing embodiments.

Figure 8:
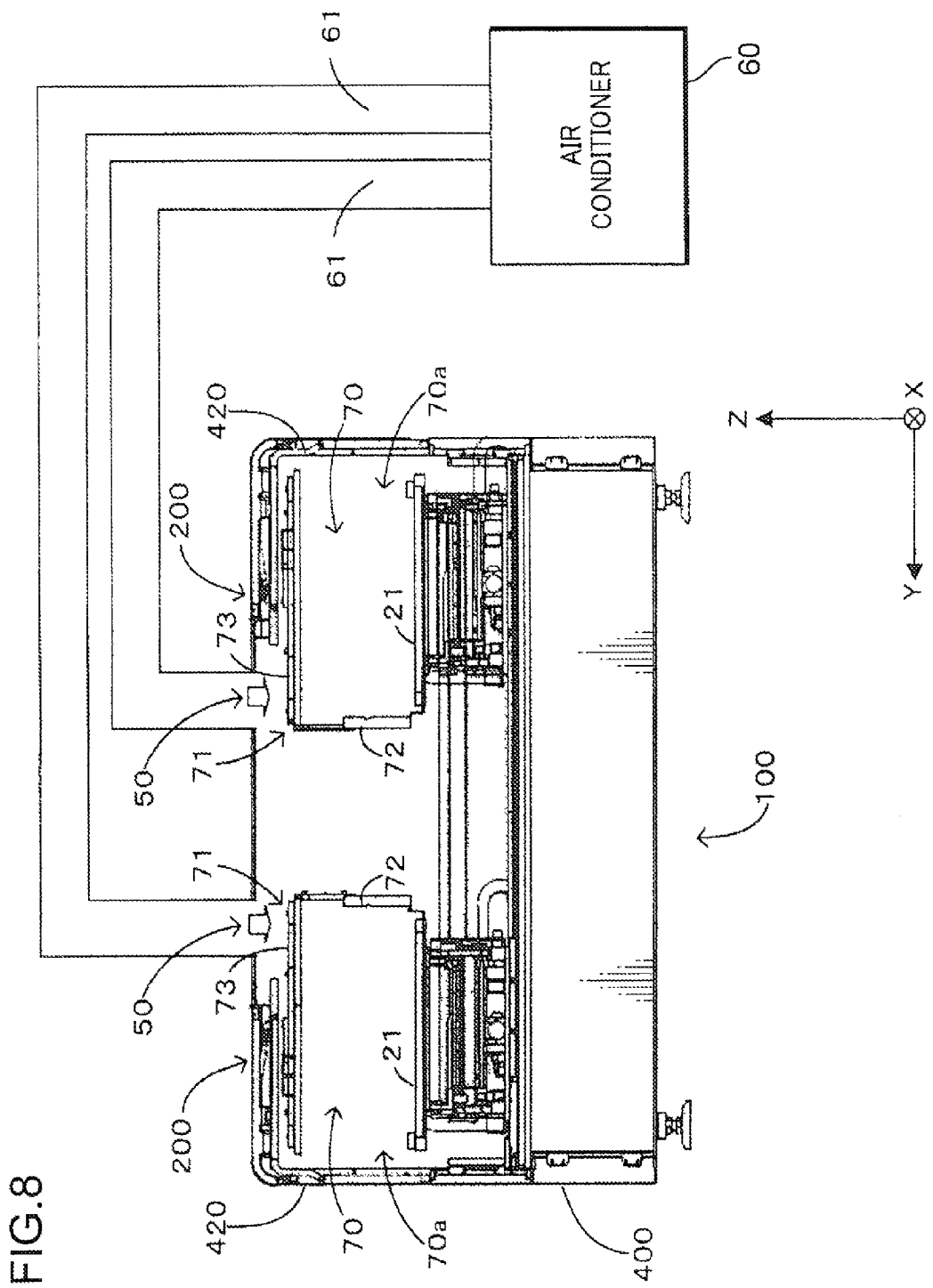
FIG. 8 is an explanatory diagram explaining the structure which cools the inside of the housing of the printer device according to the third embodiment.

FIG. 8 is an explanatory diagram explaining the structure of cooling the inside of the housing of the printer device according to the third embodiment, and shows a state where the air conditioner is connected to the printer device 100 when viewed from the X axis direction. Note that, in this diagram, the illustration of certain members such as the printing mechanism 20 is omitted. As shown in this diagram, while the duct from the air conditioner 60 is mounted respectively on the ventilation ports 50 on either side among the three ventilation ports 50, the center ventilation port 50 is closed by a ventilation port cover. Accordingly, the ventilation ports 50 for sending the air from the air conditioner 60 are provided to each of the mask holding mechanisms 70. In addition, the air that is blown out from the air conditioner 60 passes through the ducts 61 and thereafter enters the housing 400 via the ventilation ports 50. Consequently, a downward air flow heading vertically downward from the ventilation ports 50 as shown with the arrows in FIG. 8 is generated inside the housing 400, and the entire inside of the housing 400 is thereby cooled.

Particularly in this embodiment, the top panels 73 of the mask covers 71 are disposed immediately below the respective ventilation ports 50. Accordingly, the top panels 73 are cooled by directly coming into contact with the wind from the ventilation ports 50. Consequently, the mask holding frames 21 possessing thermal conductivity are cooled between the top panels 73, and consequently the solder on the upper face of the masks M of the mask holding frames 21 are also cooled. Moreover, in this embodiment also, a mask cover 71 is provided for blocking the wind from the ventilation ports 50 heading toward the mask holding frames 21, and the drying of the solder on the upper face of the masks M is thereby inhibited.

As explained above, in this embodiment also, the inside of the housing 400 of the printer 100 is cooled by the wind from the ventilation port 50 and, consequently, the temperature of the solder SP on the mask M surface supported by the mask holding frame 21 inside the housing 400 can be kept low. In addition, provided is a mask cover 71 for blocking the air flow from the ventilation port 50 toward the mask M, and the drying of the solder SP caused by the wind from the ventilation port 50 is inhibited by preventing the wind from the ventilation port 50 from coming into contact with the solder SP on the mask M surface. Accordingly, the present invention cools the solder SP while inhibiting the drying of the solder SP and, consequently, it is possible to realize favorable printing while appropriately inhibiting the change in viscosity of the solder SP.

In addition, with this embodiment, the mask cover 71 has thermal conductivity with the mask holding frame 21, and is configured such that, by the mask cover 71 being cooled by the wind that is sent from the ventilation port 50 and comes into contact with the top panel 73 of the mask cover 71, the surface of the mask M supported by the mask holding frame 21, which has thermal conductivity with the mask cover 71, is cooled. With the foregoing configuration where the mask cover 71 which blocks the wind from the ventilation port 50 is given thermal conductivity relative to the mask holding frame 21, when the mask cover 71 is cooled by the wind from the ventilation port 50, the surface of the mask M supported by the mask holding frame 21 is also cooled, and, consequently, the solder SP on the mask M surface can be efficiently cooled. Accordingly, it is possible to reliably cool the solder SP while inhibiting the solder SP from becoming dry by preventing the wind from the ventilation port 50 from coming into contact with the solder SP, and more effectively yield the effect of realizing favorable printing while appropriately inhibiting the change in viscosity of the solder SP.

Moreover, in this embodiment, the ventilation ports 50 for sending wind from the air conditioner 60 are provided respective to each of the two mask holding mechanisms 70, and the mask covers 71 are configured to be cooled by the wind from the ventilation ports 50 provided to the mask holding mechanisms 70 to which the mask holding mechanisms 70 belong. This kind of configuration is advantageous in that the freedom of layout can be improved such being able to dispose the ventilation ports 50 close to the mask holding mechanisms 70.

Fourth Embodiment

The printer device 100 of the fourth embodiment comprises a configuration in which, as with the third embodiment, the ventilation ports 50 for sending wind from the air conditioner 60 are provided to each of the two mask holding mechanisms 70. However, in the fourth embodiment, a valve is provided midway in the duct connecting the respective ventilation ports 50 and the air conditioner 60, and the fourth embodiment differs from the above embodiment in that the valve is controlled based on the detection result of the temperature sensors SC. Note that the remaining configuration of the fourth embodiment is common with the foregoing embodiments and, therefore, the differences with the foregoing embodiments are mainly explained below. By way of reference, in the fourth embodiment also, it goes without saying that the same effect can be yielded by comprising the common configuration as the foregoing embodiments.

Figure 9:
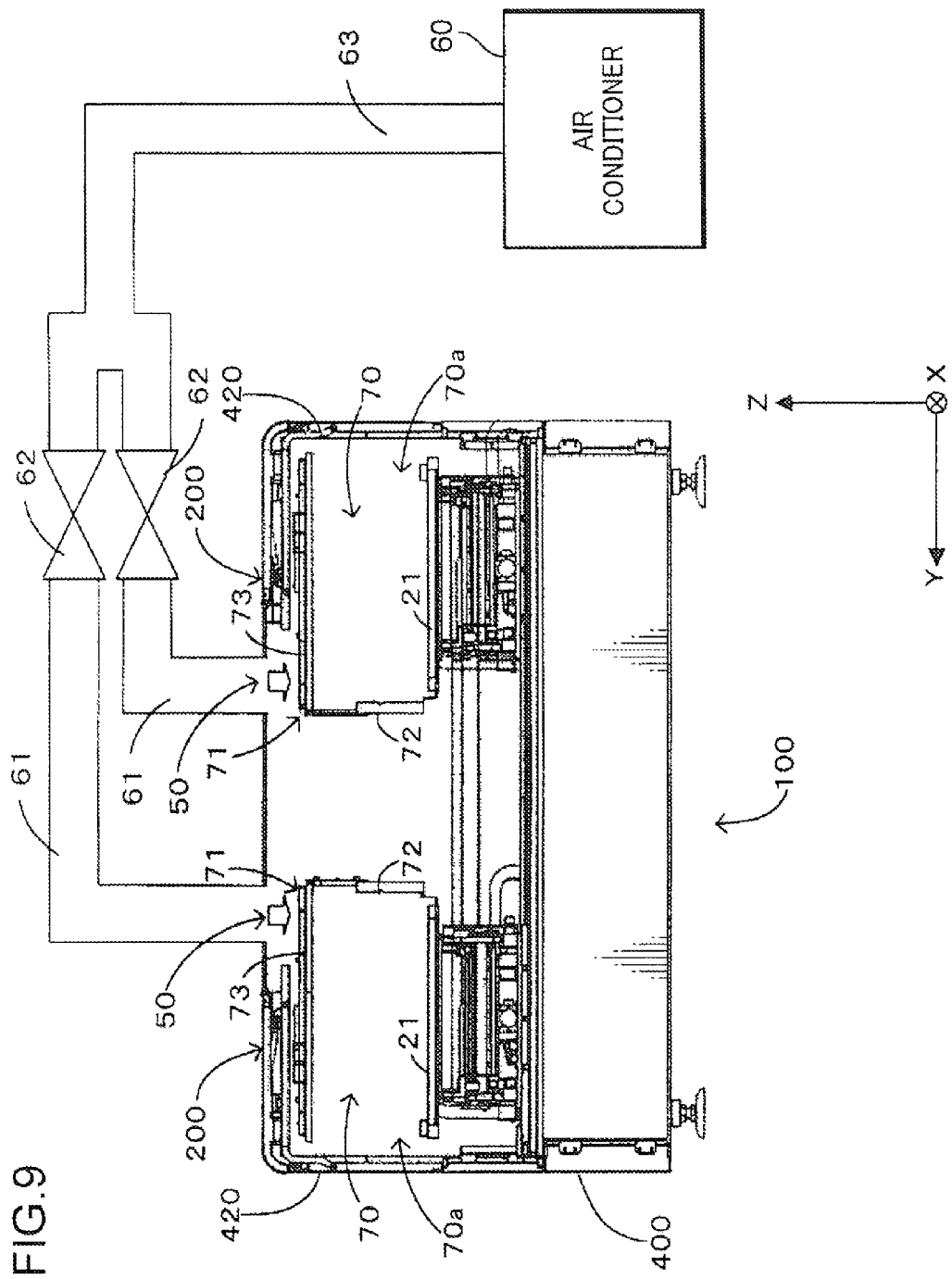
FIG. 9 is an explanatory diagram explaining the structure which cools the inside of the housing of the printer device according to the fourth embodiment.

FIG. 9 is an explanatory diagram explaining the structure which cools the inside of the housing of the printer device according to the fourth embodiment, and shows a state where the air conditioner is connected to the printer device 100 viewed from the X axis direction. Note that, in this diagram, the illustration of certain members such as the printing mechanism 20 is omitted. As shown in this diagram, to the other end of the ducts 61 in which one end thereof is connected to the ventilation ports 50, valves 62 are mounted. In addition, these ducts 61 are connected to the duct 63 extending from the air conditioner 60 via the valves 62. Accordingly, as a result of opening and closing the valves 62 as needed, the blast from the air conditioner 60 to the corresponding ventilation ports 50 can be stopped. In addition, in the fourth embodiment, the following temperature regulation operation is performed to the configuration shown in FIG. 9.

Figure 10:
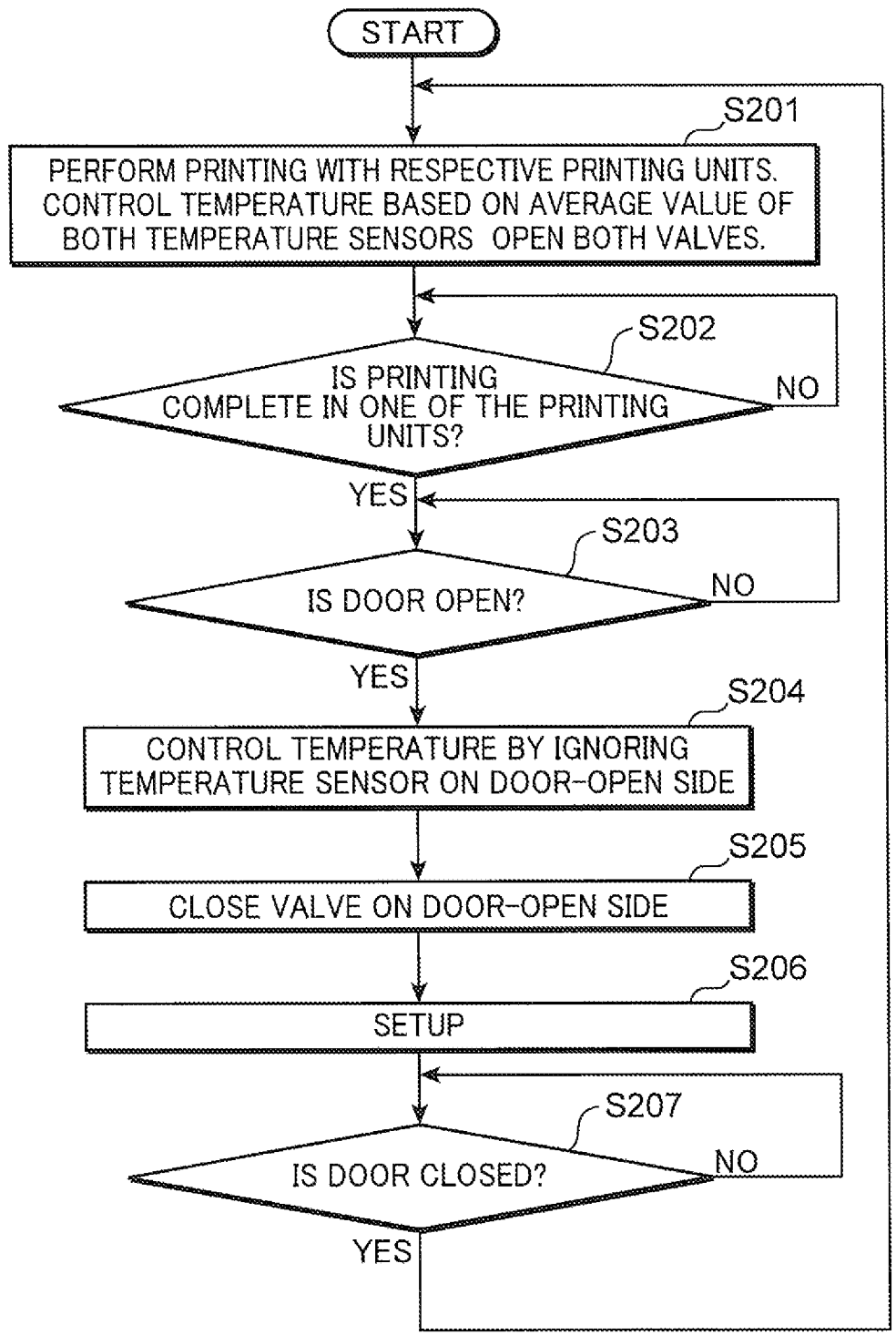
FIG. 10 is a flowchart showing the temperature regulation operation in the housing that is executed in the fourth embodiment.

FIG. 10 is a flowchart showing the temperature regulation operation in the housing that is executed in the fourth embodiment. While the solder printing to the substrate S is being performed by both of the two printing units 200, the air conditioner control part controls the operation of the air conditioner 60 based on the average value of the detection results of the two temperature sensors SC (step S201). Note that, in step S201, both valves 62 are open, and air from the air conditioner 60 is being sent to the respective printing units 200.

Meanwhile, of the two printing units 200, when one printing unit 200 completes its printing (step S202), and the operator opens the door 420 of the printing unit 200 for the setup operation after the printing is complete (step S203), step S204 is executed. In other words, the air conditioner control part 610 ignores the detection result of the temperature sensor SC provided to the mask holding mechanism 70 of the printing unit 200 of the open door 420 side, and controls the operation of the air conditioner 60 only based on the detection result of the temperature sensor SC provided to the mask holding mechanism 70 of the printing unit 200 on the closed door 420 side.

In addition, the air conditioner control part 610 of the fourth embodiment closes the valve 62 connected to the ventilation port 50 that is blasting air to the mask holding mechanism 70 of the printing unit 200 on the open door 420 side, and stops the blasting of air to the ventilation port 50 (step S205). In addition, when the operator completes the setup operation (step S206) and closes the door 420 that was open (step S207), the routine returns to the temperature regulation operation in step S101.

As explained above, in this embodiment, when the door 420 is opened, the blasting of air to the ventilation port 50 provided to the mask holding mechanism 70 of the open door 420 side. With the foregoing configuration, it is possible to stop unnecessary blast to the mask holding mechanism 70 that is not used in printing since the door 420 is open, and thereby contribute to energy saving.

Fifth Embodiment

The printer device 100 of the fifth embodiment comprises, similar to the third embodiment, a configuration of providing the ventilation ports 50 for sending air from the air conditioner 60 to each of the two mask holding mechanisms 70. However, in the fifth embodiment, the detailed configuration of the air conditioner 60 differs from the foregoing embodiments. Note that the remaining configuration of the fifth embodiment is common with the foregoing embodiments and, therefore, the differences with the foregoing embodiments are mainly explained below. By way of reference, in the fifth embodiment also, it goes without saying that the same effect can be yielded by comprising the common configuration as the foregoing embodiments.

Figure 11:
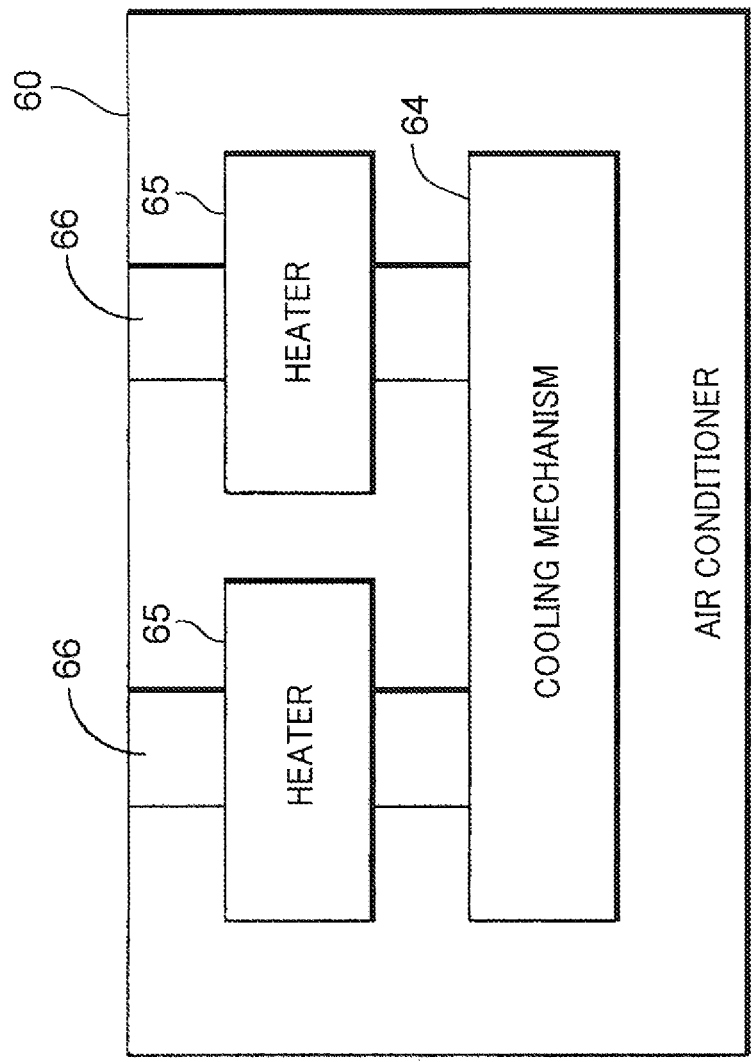
FIG. 11 is a block diagram showing the configuration of the air conditioner according to the fifth embodiment.

FIG. 11 is a block diagram showing the configuration of the air conditioner according to the fifth embodiment. This air conditioner 60 cools the air to a predetermined cooling temperature (for instance, 18° C.) with a cooling mechanism 64, and thereafter heats the air to a predetermined adjustment temperature (for instance, 20° C.) with a heater 65. Moreover, as shown in FIG. 11, two air passages 66 extend from the same cooling mechanism 64, and the heaters 65 are provided midway to each of the air passages 66. In addition, each of the air passages 66 is connected to the ducts 61 shown in FIG. 8. Accordingly, are that was subject to temperature regulation by one heater 65 is blasted to one mask holding mechanism 70, and air that was subject to temperature regulation by the other heater 65 is blasted to the other mask holding mechanism 70. In addition, with the fifth embodiment, the following temperature regulation operation is executed by using the air conditioner 60 shown in FIG. 11.

FIG. 12 is a flowchart showing the temperature regulation operation in the housing that is executed in the fifth embodiment. While the solder printing to the substrate S is being performed by both of the two printing units 200, the air conditioner control part 610 controls the operation of the air conditioner 60 based on the average value of the detection results of the two temperature sensors SC (step S301).

Moreover, in step S301, both heaters 65 are operating, and temperature-regulated air is being sent to each of the printing units 200. However, the amount of heat generated by the heaters 65 is independently controlled. In other words, the amount of heat generation of one heater 65 is controlled based on the detection result of the temperature sensor SC provided to the mask holding mechanism 70 which is blasted by one heater 65. Moreover, the amount of heat generation of the other heater 65 is controlled based on the detection result of the temperature sensor SC provided to the mask holding mechanism 70 blasted by the other heater 65.

Meanwhile, of the two printing units 200, when one printing unit 200 completes its printing (step S302), and the operator opens the door 420 of the printing unit 200 for the setup operation after the printing is complete (step S303), step S304 is executed. In other words, in step S304, the air conditioner control part 610 stops the generation of heat by the heater 65 corresponding to the mask holding mechanism 70 of the printing unit 200 on the open door 420 side, and operates the air conditioner 60 in an energy saving mode. In addition, when the operator completes the setup operation (step S305) and closes the door 420 that was open (step S306), the routine returns to the temperature regulation operation in step S301.

As explained above, in the fifth embodiment, the air conditioner 60 includes a cooling mechanism 64 for cooling air, and heaters 65 for regulating the temperature of air that was cooled by the cooling mechanism 64 for each of the ventilation ports 50. In addition, the air that was subject to temperature regulation by the heaters 65 is sent into the housing 400 from the ventilation ports 50. When the door 420 is subsequently in the foregoing state, the heater 65 for regulating the temperature of the wind sent by the ventilation port 50 provided to the mask holding mechanism 70 on the open door 420 side is stopped. With the foregoing configuration, the temperature of the wind to the mask holding mechanism 70 that is not used in printing since the door 420 is open will not be uselessly regulated in the heaters 65, and it is thereby possible to contribute to energy saving.

Note that the present invention is not limited to the foregoing embodiments, and may be modified variously to the extent that such modification does not deviate from the gist of this invention. For example, the foregoing embodiments explained a case of applying the present invention to the printer device 100 comprising two printing units 200. Nevertheless, the present invention can also be applied to a printer device 100 comprising a single printing unit 200.

Moreover, in the foregoing embodiments, the mask holding frame 21 and the mask cover 71 mutually possessed thermal conductivity, and the mask holding frame 21 could be cooled by cooling the mask cover 71. Nevertheless, the configuration may also be such that there is no thermal conductivity between the mask holding frame 21 and the mask cover 71, and the mask holding frame 21 is not cooled even when the mask cover 71 is cooled. In the foregoing case also, since the inside of the housing 400 of the printer device 100 is cooled by the air from the ventilation port 50, the temperature of the solder SP on the mask M surface supported by the mask holding frame 21 inside the housing 400 can be kept low. In addition, since a mask cover 71 for blocking the air flow from the ventilation port 50 toward the mask M is also provided, the drying of the solder SP caused by this blast cooling is inhibited. Accordingly, the present invention cools the solder SP while inhibiting the drying of the solder SP and, consequently, it is possible to realize favorable printing while appropriately inhibiting the change in viscosity of the solder SP.

Moreover, the specific configuration and material of the mask cover 71 can also be variously modified from those described above. In other words, any configuration and material may be adopted so as long as it is possible to block the air from the ventilation port 50.

Moreover, in the foregoing embodiments, the temperature of the upper face of the mask M was detected by the temperature sensors SC. Nevertheless, the locations where the temperature is to be detected by the temperature sensors SC is not limited to the upper face of the mask M, and the temperature of the solder SP on the supper face of the mask M may also be measured.

Moreover, in the fifth embodiment, the generation of heat by the heater 65 was stopped in the energy saving mode. Here, in the energy saving mode, it is also possible to stop the blast to the ventilation port 50 provided to the mask holding mechanism 70 on the open door 420 side.

Summary of Embodiments

The printer device according to the present invention is a printer device which prints a solder on a substrate superimposed on a rear surface of a mask via pattern holes of the mask by moving the solder on a surface of the mask supported inside the printer device. In order to achieve the foregoing object, this printer device comprises a ventilation port 50 formed for blowing air into the device from an external air blower, and a mask holding mechanism 70 for holding the mask M. Note that the mask holding mechanism includes a support member 21 for supporting the mask, and a blocking member 71 for preventing an air flow introduced from the ventilation port 50 from directly coming into contact with the mask M supported by the support member 21. Moreover, the solder SP on the surface of the mask M is cooled as a result of the inside of the device being cooled by air from the ventilation port 50.

The temperature regulation method of a printer device according to the present invention is a temperature regulation method of a printer device which prints a solder SP on a substrate superimposed on a rear surface of a mask M via pattern holes of the mask M by moving the solder on a surface of the mask M supported inside the printer device, and the printer device is provided with a mask holding mechanism including a support member 21 for supporting the mask M and a blocking member 71. Note that the temperature regulation method comprises the steps of cooling the solder on the surface of the mask as a result of cooling an inside of the device by blowing an air flow from a ventilation port 50 to the inside of the device, and preventing the air flow introduced from the ventilation port 50 from directly coming into contact with the mask M by means of the blocking member 71.

The temperature regulation system of a printer device according to the present invention is a temperature regulation system of a printer device comprising a printer device which prints a solder on a substrate superimposed on a rear surface of a mask via pattern holes of the mask by moving the solder SP on a surface of the mask M supported inside the printer device, and an air blower for blasting air into the printer device from a ventilation port 50 provided to the printer device. Note that that the printer device includes a ventilation port 50 formed for blowing air into the device from an external air blower 60, and a mask holding mechanism 70 for holding the mask M. The mask holding mechanism 70 includes a support member 21 for supporting the mask, and a blocking member 71 for preventing an air flow introduced from the ventilation port 50 from directly coming into contact with the mask M supported by the support member 21. The solder SP on the surface of the mask M is cooled as a result of the inside of the device being cooled by air from the ventilation port 50.

With the invention (printer device, temperature regulation method of a printer device, and temperature regulation system of a printer device), since the inside of the device is cooled by the air from a ventilation port 50, consequently, the temperature of the solder on the mask surface supported by a support member 21 inside the printer device can be kept low. However, upon adopting this kind of blast cooling, a separate problem arises in that the wind from the ventilation port 50 comes into contact with the solder and dries the solder. Meanwhile, with the present invention, provided is a blocking member 71 for blocking the air flow from the ventilation port 50 toward the mask M, and the drying of the solder caused by the wind from the ventilation port 50 is inhibited by preventing the wind from the ventilation port 50 from coming into contact with the solder on the mask surface. Accordingly, the present invention cools the solder while inhibiting the drying of the solder and, consequently, it is possible to realize favorable printing while appropriately inhibiting the change in viscosity of the solder.

Here, the printer device may also be configured such that the blocking member 71 and the support member 21 mutually possess thermal conductivity, are mutually coupled, and the solder on the surface of the mask M is cooled as a result of the surface of the mask supported by the support member 21 being cooled by the blocking member 71 being cooled by the air drawn from the ventilation port 50. With the foregoing configuration where the blocking member 71 which blocks the wind from the ventilation port 50 is given thermal conductivity relative to the support member 21, when the blocking member 71 is cooled by the wind from the ventilation port 50, the surface of the mask M supported by the support member 21 is also cooled, and, consequently, the solder on the mask surface can be efficiently cooled. Accordingly, it is possible to reliably cool the solder while inhibiting the solder from becoming dry by preventing the wind from the ventilation port 50 from coming into contact with the solder, and more effectively yield the effect of realizing favorable printing while appropriately inhibiting the change in viscosity of the solder.

Moreover, the printer device may also be configured such that two mask holding mechanisms 70 are disposed side-by-side inside the device, the blocking member 71 is provided to each of the two mask holding mechanisms 70, and with only one air blower 60 being provided, each of the blocking members 71 can be cooled by the air blown from the air blower 60 to the ventilation port 50. With the printer device which enables the cooling of the blocking member 71 of each of the two mask holding mechanisms 70 by the wind from one air blower 50 as described above, the number of air blowers 60 can be reduced in comparison to the case of providing, for each of the two mask holding mechanisms 70, the air blower 50 for regulating the temperature of the blocking member 71. Thus, this is advantageous in reducing the installation area and cost of the air blower 60.

Moreover, the printer device may also be configured such that one of the two mask holding mechanisms 70 is formed with an opening 70a which opens toward an opposite side to the other one of the two mask holding mechanisms 70, the other one of the two mask holding mechanisms 70 is formed with an opening 70a which opens toward an opposite side to the one of the two mask holding mechanisms 70, and a door 420 capable of being opened and closed from an outside of the device is provided to a side facing the opening 70a. With this kind of printer device, upon performing a setup operation such as replacing the mask M of the mask holding mechanism 70, the operator can access the mask holding mechanism 70 via the opening 70a by opening the door 420, and thereby perform the setup operation. Meanwhile, upon performing solder printing on the substrate, the temperature inside the device can be stabilized without depending on the outside temperature by closing the door 420, and, therefore, it is possible to effectively realize favorable printing using a solder having appropriate viscosity.

Here, the printer device may also be configured such that each of the two mask holding mechanisms 70 is blocked by the blocking member 71 on a side of the other one of the two mask holding mechanisms 70. As a result of adopting the foregoing configuration, the atmosphere can be separated between the two mask holding mechanisms 70, and it is possible to inhibit the atmosphere temperature of one mask holding mechanism 70 from affecting the atmosphere temperature of the other mask holding mechanism 70. Accordingly, while performing the setup operation to one mask holding mechanism, it is possible to perform solder printing using the other mask holding mechanism 70 under stable atmosphere temperature. Thus, there is no need to stop the printing using the other mask holding mechanism 70 in order to perform the setup operation to the one mask holding mechanism 70, and solder printing can be efficiently performed on the substrate S.

Moreover, the printer device may also be configured such that the ventilation port 50 is provided to each of the two mask holding mechanisms 70, and the blocking member 71 is cooled by an air flow introduced from the ventilation port 50 provided to the mask holding mechanism 70 to which the blocking member 71 belongs. This kind of configuration is advantageous in that the freedom of layout can be improved such being able to dispose the ventilation port 50 close to the mask holding mechanism 70.

Note that the mode of arrangement of the ventilation port 50 is not limited to the above. For example, the printer device may also be configured such that a part 72 of the blocking member 71 of one of the two mask holding mechanisms 70 is disposed to face another part 72 of the blocking member 71 of the other one of the two mask holding mechanisms 70, the ventilation port 50 is provided between the parts 72 of the two blocking members 71 facing each other, and the two blocking members 71 are cooled by the air blown between the two blocking members 71 from the ventilation port 50.

Moreover, the temperature regulation method of a printer device can also be modified variously. For example, the temperature regulation method of a printer device may also be configured such that two mask holding mechanisms 70 are disposed side-by-side inside the printer device, and the blocking member 71 of each of the two mask holding mechanisms 70 can be cooled by the air flow from one air blower 60, and the temperature regulation method further comprises the step of controlling a blast from the air blower 60 and regulating the temperature of the surface of the mask M. As a result of controlling the blast from the air blower 60 as described above, it is possible to stabilize the temperature of the mask surface and consequently the temperature of the solder on the mask surface. Thus, it is possible to effectively realize favorable printing using a solder having appropriate viscosity.

In addition, the temperature regulation method of a printer device may also be configured such that the blocking member 71 and the support member 21 mutually possess thermal conductivity, are mutually coupled, and the solder on the surface of the mask M is cooled as a result of the surface of the mask supported by the support member 21 being cooled by the blocking member 71 being cooled by the air from the ventilation port 50. Accordingly, it is possible to reliably cool the solder while inhibiting the solder from becoming dry by preventing the wind from the ventilation port 50 from coming into contact with the solder, and more effectively yield the effect of realizing favorable printing while appropriately inhibiting the change in viscosity of the solder.

Here, the temperature regulation method of a printer device may also be configured such that each of the two mask holding mechanisms 70 is provided with a temperature sensor SC, and the blast from the air blower 60 is controlled based on a detection result of the temperature sensor SC. As a result of controlling the blast from the air blower 60 based on the detection result of the temperature sensor SC as described above, it is possible to surely stabilize the temperature of the solder on the mask surface, and effectively realize favorable printing using a solder having appropriate viscosity.

In addition, the temperature regulation method of a printer device may also be configured such that each of the two mask holding mechanisms 70 is formed with an opening 70a which opens toward an opposite side to another mask holding mechanism 70, and, in the printer device, a door 420 capable of being opened and closed from an outside of the device is provided to a side facing the opening 70a of each of the two mask holding mechanisms 70, and, when the door 420 is opened, the detection result of the temperature sensor SC provided to the mask holding mechanism 70 facing the opened door 420 is ignored while the blast from the air blower 60 is controlled based on the detection result of the temperature sensor SC provided to the mask holding mechanism 70 facing the closed door. With the foregoing configuration, it is possible to eliminate the influence of the atmosphere temperature of the mask holding mechanism 70 that is not used in printing since the door 420 is open, and regulate the atmosphere temperature of the mask holding mechanism 70 that can be used in printing since the door 420 is closed. Accordingly, even if the atmosphere temperature of the mask holding mechanism 70 changes considerably due to the outside air since the door 420 is open, the mask holding mechanism 70 in which the door 420 is closed can be used to perform printing with a stable temperature regardless of the foregoing temperature change. Consequently, it is possible to stabilize the temperature of the solder on the mask surface, and effectively realize favorable printing using a solder having appropriate viscosity.

Moreover, the temperature regulation method of a printer device may also be configured such that one of the two mask holding mechanisms 70 is formed with an opening 70a which opens toward an opposite side to the other one of the two mask holding mechanisms 70, and the other one of the two mask holding mechanisms 70 is formed with an opening 70a which opens toward an opposite side to the one pf the two mask holding mechanisms 70, a door 420 capable of being opened and closed from an outside of the device is provided to a side facing the opening 70a, and, in the printer device, the ventilation port 50 is provided to each of the two mask holding mechanisms 70, and the blocking member 71 is cooled by the air flow introduced from the ventilation port 50 provided to the mask holding mechanism 70 to which the blocking member 71 belongs.

Here, the temperature regulation method of a printer device may also be configured such that, when the door 420 is opened, the blast from the ventilation port 50 provided to the mask holding mechanism 70 facing the open door 420 is stopped. With the foregoing configuration, it is possible to stop unnecessary blast to the mask holding mechanism 70 that is not used in printing since the door 420 is open, and thereby contribute to energy saving.

Otherwise, the temperature regulation method of a printer device may also be configured such that the air blower 60 includes a cooling unit 64 for cooling gas, includes, for each of the ventilation ports 50, a heater 65 for regulating the temperature of the gas cooled by the cooling unit 64, and is configured to blow gas, which has been subjected to temperature regulation by the heater 65, from the ventilation port 50 to the inside of the device, and, when the door 420 is opened, the heater 65 for regulating the temperature of the blast from the ventilation port 50 provided to the mask holding mechanism 70 facing the open door 420 is stopped. With the foregoing configuration, the temperature of the wind to the mask holding mechanism 70 that is not used in printing since the door 420 is open will not be uselessly regulated in the heater SC, and it is thereby possible to contribute to energy saving.

EXPLANATION OF REFERENCE NUMERALS

100 . . . printer device (temperature regulation system of printer device)
2 . . . support frame
20 . . . mask raising/lowering mechanism
200 . . . printing unit
21 . . . mask holding frame (support member)
30 . . . printing mechanism
300 . . . substrate carrying unit
40 . . . squeegee
410 . . . door
420 . . . door
50 . . . ventilation port
500 . . . controller (control means)
610 . . . air conditioner control part (control means)
60 . . . air conditioner (air blower, temperature regulation system of printer device)
61 . . . duct
62 . . . valve
63 . . . duct
64 . . . cooling mechanism
65 . . . heater
70a . . . opening
70 . . . mask holding mechanism
71 . . . mask cover (blocking member)
72 . . . wall panel (blocking member)
73 . . . top panel (blocking member)
M . . . mask
S . . . substrate
SC . . . temperature sensor
SP . . . solder This application is based on Japanese Patent Application Serial No. 2012-011964 filed in Japan Patent Office on Jan. 24, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printer device which prints a solder on a substrate superimposed on a rear surface of a mask via pattern holes of the mask by moving the solder on a surface of the mask supported inside the printer device, the printer device comprising:
 a ventilation port formed for blowing air into the device from an external air blower; and
 a mask holding mechanism for holding the mask, including:
  a support member for supporting the mask; and
  a blocking member for preventing an air flow introduced from the ventilation port from directly coming into contact with the mask supported by the support member,
 wherein the solder on the surface of the mask is cooled as a result of the inside of the device being cooled by air from the ventilation port.

2. The printer device as defined in claim 1, wherein the blocking member and the support member mutually possess thermal conductivity, are coupled mutually, and the solder on the surface of the mask is cooled as a result of the surface of the mask supported by the support member being cooled by the blocking member being cooled by the air from the ventilation port.

3. The printer device as defined in claim 2, wherein
 two mask holding mechanisms are disposed side-by-side inside the device, the blocking member is provided to each of the two mask holding mechanisms, and
 wherein only one air blower is provided, each of the blocking members can be cooled by the air blown from said one air blower to the ventilation port.

4. The printer device as defined in claim 3, wherein
 one of the two mask holding mechanisms is formed with an opening which opens toward an opposite side to the other one of two mask holding mechanisms,
 the other one of the two mask holding mechanisms is formed with an opening which opens toward an opposite side to the one of the two mask holding mechanisms, and
 a door capable of being opened and closed from an outside of the device is provided to a side facing the opening.

5. The printer device as defined in claim 4, wherein each of the two mask holding mechanisms is blocked by the blocking member on a side of the other one of the two mask holding mechanisms.

6. The printer device as defined in claim 3, wherein
the ventilation port is provided to each of the two mask holding mechanisms, and
the blocking member is cooled by an air flow introduced from the ventilation port provided to the mask holding mechanism to which the blocking member belongs.

7. The printer device as defined in claim 3, wherein
a part of the blocking member of one of the two mask holding mechanisms is disposed to face another part of the blocking member of the other one of the two mask holding mechanisms,
the ventilation port is provided between the parts of the two blocking members facing each other, and
the two blocking members are cooled by the air blown between the two blocking members from the ventilation port.

8. A temperature regulation method of a printer device which prints a solder on a substrate superimposed on a rear surface of a mask via pattern holes of the mask by moving the solder on a surface of the mask supported inside the printer device, where the printer device being provided with a mask holding mechanism including a support member for supporting the mask and a blocking member,
the temperature regulation method comprising the steps of:
cooling the solder on the surface of the mask as a result of cooling an inside of the device by blowing an air flow from a ventilation port to the inside of the device; and
blocking the air flow introduced from the ventilation port from directly coming into contact with the mask by means of the blocking member.

9. The temperature regulation method as defined in claim 8, wherein the blocking member and the support member mutually possess thermal conductivity, are mutually coupled, and the solder on the surface of the mask is cooled as a result of the surface of the mask supported by the support member being cooled by the blocking member being cooled by the air from the ventilation port.

10. The temperature regulation method as defined in claim 9, wherein
two mask holding mechanisms are disposed side-by-side inside the printer device, and the blocking member of each of the two mask holding mechanisms is cooled by the air flow from one air blower,
the temperature regulation method further comprising a step of:
controlling a blast from the air blower and regulating a temperature of the surface of the mask.

11. The temperature regulation method as defined in claim 10, wherein each of the two mask holding mechanisms is provided with a temperature sensor, and the blast from the air blower is controlled based on a detection result of the temperature sensor.

12. The temperature regulation method as defined in claim 11, wherein
each of the two mask holding mechanisms is formed with an opening which opens toward an opposite side to another mask holding mechanism, and, in the printer device, a door capable of being opened and closed from an outside of the device is provided to a side facing the opening of each of the two mask holding mechanisms, and
when the door is opened, the detection result of the temperature sensor provided to the mask holding mechanism facing the opened door is ignored while the blast from the air blower is controlled based on the detection result of the temperature sensor provided to the mask holding mechanism facing the closed door.

13. The temperature regulation method as defined in claim 10, wherein
one of the two mask holding mechanisms is formed with an opening which opens toward an opposite side to the other one of the two mask holding mechanisms, and the other one of the two mask holding mechanisms is formed with an opening which opens toward an opposite side to the one of the two mask holding mechanisms,
a door capable of being opened and closed from an outside of the device is provided to a side facing the opening, and
in the printer device, the ventilation port is provided to each of the two mask holding mechanisms, and the blocking member is cooled by the air flow introduced from the ventilation port provided to the mask holding mechanism to which the blocking member belongs.

14. The temperature regulation method as defined in claim 13, wherein, when the door is opened, the blast from the ventilation port provided to the mask holding mechanism facing the open door is stopped.

15. The temperature regulation method as defined in claim 13, wherein
the air blower includes a cooling unit for cooling gas, includes, for each ventilation port, a heater for regulating the temperature of the gas cooled by the cooling unit, and is configured to blow gas, which has been subjected to temperature regulation by the heater, from the ventilation port to the inside of the device, and
when the door is opened, the heater for regulating the temperature of the blast from the ventilation port provided to the mask holding mechanism facing the open door is stopped.

16. A temperature regulation system having a printer device which prints a solder on a substrate superimposed on a rear surface of a mask via pattern holes of the mask by moving the solder on a surface of the mask, and an air blower for blasting air into the printer device from a ventilation port provided to the printer device,
the printer device having:
a ventilation port formed for blowing air into the device from an external air blower; and
a mask holding mechanism for holding the mask, including:
a support member for supporting the mask; and
a blocking member for preventing an air flow introduced from the ventilation port from directly coming into contact with the mask supported by the support member,
wherein solder on the surface of the mask is cooled as a result of the inside of the device being cooled by air from the ventilation port.

* * * * *